(12) United States Patent
Kevwitch

(10) Patent No.: US 7,789,971 B2
(45) Date of Patent: Sep. 7, 2010

(54) TREATMENT OF SUBSTRATE USING FUNCTIONALIZING AGENT IN SUPERCRITICAL CARBON DIOXIDE

(75) Inventor: Robert Kevwitch, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 545 days.

(21) Appl. No.: 10/908,474

(22) Filed: May 13, 2005

(65) Prior Publication Data

US 2006/0254615 A1 Nov. 16, 2006

(51) Int. Cl.
*B08B 7/00* (2006.01)
*C23G 1/00* (2006.01)
*B08B 3/00* (2006.01)

(52) U.S. Cl. .................. 134/26; 134/2; 134/3; 134/28; 134/30; 134/32; 134/33

(58) Field of Classification Search ..................... 134/26
See application file for complete search history.

(56) References Cited

U.S. PATENT DOCUMENTS

| | | | |
|---|---|---|---|
| 2,439,689 A | 4/1948 | Hyde | 117/124 |
| 2,617,719 A | 11/1952 | Stewart | 23/312 |
| 2,625,886 A | 1/1953 | Browne | 103/150 |
| 3,642,020 A | 2/1972 | Payne | 137/112 |
| 3,660,160 A * | 5/1972 | Powers et al. | 134/22.19 |
| 3,744,660 A | 7/1973 | Gaines et al. | 220/10 |
| 3,890,176 A | 6/1975 | Bolon | 156/2 |
| 3,900,551 A | 8/1975 | Bardoncelli et al. | 423/9 |
| 3,968,885 A | 7/1976 | Hassan et al. | 214/1 BC |
| 4,029,517 A | 6/1977 | Rand | 134/11 |
| 4,091,643 A | 5/1978 | Zucchini | 68/18 C |
| 4,219,333 A | 8/1980 | Harris | 8/137 |
| 4,245,154 A | 1/1981 | Uehara et al. | 250/227 |
| 4,341,592 A | 7/1982 | Shortes et al. | 156/643 |
| 4,349,415 A | 9/1982 | DeFilippi et al. | 204/14 |

(Continued)

FOREIGN PATENT DOCUMENTS

CH     SE 251213     8/1948

(Continued)

OTHER PUBLICATIONS

Encyclopedia Britannica Online. http://www.britannica.com/EBchecked/topic/431995/organohalogen-compound. p. 1. Acquired Oct. 31, 2008.*

(Continued)

*Primary Examiner*—Michael Cleveland
*Assistant Examiner*—Nicole Blan
(74) *Attorney, Agent, or Firm*—Wood, Herron & Evans, LLP

(57) ABSTRACT

During the processing of substrates, the substrate surface may be subjected to a cleaning process using supercritical $CO_2$. Surface matter may remain, for example, because it is only minimally soluble in the supercritical $CO_2$. For example, an oxidation cleaning process causes the substrate structure to cleave at several points leaving smaller fragments of oxidized residue behind. This residue has only minimal solubility in supercritical $CO_2$ due to the polar constituents resulting from oxidation. The method thus further includes processing the substrate with supercritical $CO_2$ and a functionalizing agent that can react with the smaller fragments and/or other less soluble components. These functionalized components are rendered more soluble in supercritical $CO_2$ and are more easily removed than their predecessors.

17 Claims, 3 Drawing Sheets

U.S. PATENT DOCUMENTS

| | | | | |
|---|---|---|---|---|
| 4,355,937 A | 10/1982 | Mack et al. | | 414/217 |
| 4,367,140 A | 1/1983 | Wilson | | 210/110 |
| 4,406,596 A | 9/1983 | Budde | | 417/393 |
| 4,422,651 A | 12/1983 | Platts | | 277/206 R |
| 4,474,199 A | 10/1984 | Blaudszun | | 134/105 |
| 4,475,993 A | 10/1984 | Blander et al. | | 204/64 |
| 4,522,788 A | 6/1985 | Sitek et al. | | 422/78 |
| 4,549,467 A | 10/1985 | Wilden et al. | | 91/307 |
| 4,592,306 A | 6/1986 | Gallego | | 118/719 |
| 4,601,181 A | 7/1986 | Privat | | 68/18 C |
| 4,626,509 A | 12/1986 | Lyman | | 435/287 |
| 4,670,126 A | 6/1987 | Messer et al. | | 204/298 |
| 4,682,937 A | 7/1987 | Credle, Jr. | | 417/393 |
| 4,693,777 A | 9/1987 | Hazano et al. | | 156/345 |
| 4,749,440 A | 6/1988 | Blackwood et al. | | 156/646 |
| 4,778,356 A | 10/1988 | Hicks | | 417/397 |
| 4,788,043 A | 11/1988 | Kagiyama et al. | | 422/292 |
| 4,789,077 A | 12/1988 | Noe | | 220/319 |
| 4,823,976 A | 4/1989 | White, III et al. | | 220/211 |
| 4,825,808 A | 5/1989 | Takahashi et al. | | 118/719 |
| 4,827,867 A | 5/1989 | Takei et al. | | 118/64 |
| 4,838,476 A | 6/1989 | Rahn | | 228/180.1 |
| 4,865,061 A | 9/1989 | Fowler et al. | | 134/108 |
| 4,877,530 A | 10/1989 | Moses | | 210/511 |
| 4,879,004 A | 11/1989 | Oesch et al. | | 203/89 |
| 4,879,431 A | 11/1989 | Bertoncini | | 435/311 |
| 4,917,556 A | 4/1990 | Stark et al. | | 414/217 |
| 4,923,828 A | 5/1990 | Gluck et al. | | 437/225 |
| 4,924,892 A | 5/1990 | Kiba et al. | | 134/123 |
| 4,925,790 A | 5/1990 | Blanch et al. | | 435/52 |
| 4,933,404 A | 6/1990 | Beckman et al. | | 523/207 |
| 4,944,837 A | 7/1990 | Nishikawa et al. | | 156/646 |
| 4,951,601 A | 8/1990 | Maydan et al. | | 118/719 |
| 4,960,140 A | 10/1990 | Ishijima et al. | | 134/31 |
| 4,983,223 A | 1/1991 | Gessner | | 134/25.4 |
| 5,011,542 A | 4/1991 | Weil | | 134/38 |
| 5,013,366 A | 5/1991 | Jackson et al. | | 134/1 |
| 5,044,871 A | 9/1991 | Davis et al. | | 414/786 |
| 5,062,770 A | 11/1991 | Story et al. | | 417/46 |
| 5,068,040 A | 11/1991 | Jackson | | 210/748 |
| 5,071,485 A | 12/1991 | Matthews et al. | | 134/2 |
| 5,091,207 A | 2/1992 | Tanaka | | 427/8 |
| 5,105,556 A | 4/1992 | Kurokawa et al. | | 34/12 |
| 5,143,103 A | 9/1992 | Basso et al. | | 134/98.1 |
| 5,158,704 A | 10/1992 | Fulton et al. | | 252/309 |
| 5,167,716 A | 12/1992 | Boitnott et al. | | 118/719 |
| 5,169,296 A | 12/1992 | Wilden | | 417/395 |
| 5,169,408 A | 12/1992 | Biggerstaff et al. | | 29/25.01 |
| 5,174,917 A | 12/1992 | Monzyk | | 252/60 |
| 5,185,058 A | 2/1993 | Cathey, Jr. | | 156/656 |
| 5,185,296 A | 2/1993 | Morita et al. | | 437/229 |
| 5,186,594 A | 2/1993 | Toshima et al. | | 414/217 |
| 5,186,718 A | 2/1993 | Tepman et al. | | 29/25.01 |
| 5,188,515 A | 2/1993 | Horn | | 417/63 |
| 5,190,373 A | 3/1993 | Dickson et al. | | 366/146 |
| 5,191,993 A | 3/1993 | Wanger et al. | | 220/333 |
| 5,193,560 A | 3/1993 | Tanaka et al. | | 134/56 R |
| 5,195,878 A | 3/1993 | Sahiavo et al. | | 417/393 |
| 5,196,134 A | 3/1993 | Jackson | | 252/103 |
| 5,201,960 A | 4/1993 | Starov | | 134/11 |
| 5,213,485 A | 5/1993 | Wilden | | 417/393 |
| 5,213,619 A | 5/1993 | Jackson et al. | | 134/1 |
| 5,215,592 A | 6/1993 | Jackson | | 134/1 |
| 5,217,043 A | 6/1993 | Novakovi | | 137/460 |
| 5,221,019 A | 6/1993 | Pechacek et al. | | 220/315 |
| 5,222,876 A | 6/1993 | Budde | | 417/393 |
| 5,224,504 A | 7/1993 | Thompson et al. | | 134/155 |
| 5,225,173 A | 7/1993 | Wai | | 423/2 |
| 5,236,602 A | 8/1993 | Jackson | | 210/748 |
| 5,236,669 A | 8/1993 | Simmons et al. | | 422/113 |
| 5,237,824 A | 8/1993 | Pawliszyn | | 62/51.1 |
| 5,238,671 A | 8/1993 | Matson et al. | | 423/397 |
| 5,240,390 A | 8/1993 | Kvinge et al. | | 417/393 |
| 5,243,821 A | 9/1993 | Schuck et al. | | 62/50.6 |
| 5,246,500 A | 9/1993 | Samata et al. | | 118/719 |
| 5,250,078 A | 10/1993 | Saus et al. | | 8/475 |
| 5,251,776 A | 10/1993 | Morgan, Jr. et al. | | 220/360 |
| 5,261,965 A | 11/1993 | Moslehi | | 134/1 |
| 5,266,205 A | 11/1993 | Fulton et al. | | 210/639 |
| 5,267,455 A | 12/1993 | Dewees et al. | | 68/5 C |
| 5,269,815 A | 12/1993 | Schlenker et al. | | 8/475 |
| 5,269,850 A | 12/1993 | Jackson | | 134/2 |
| 5,274,129 A | 12/1993 | Natale et al. | | 549/349 |
| 5,280,693 A | 1/1994 | Heudecker | | 53/306 |
| 5,285,352 A | 2/1994 | Pastore et al. | | 361/707 |
| 5,288,333 A | 2/1994 | Tanaka et al. | | 134/31 |
| 5,290,361 A | 3/1994 | Hayashida et al. | | 134/2 |
| 5,294,261 A | 3/1994 | McDermott et al. | | 134/7 |
| 5,298,032 A | 3/1994 | Schlenker et al. | | 8/475 |
| 5,304,515 A | 4/1994 | Morita et al. | | 437/231 |
| 5,306,350 A | 4/1994 | Hoy et al. | | 134/22.14 |
| 5,312,882 A | 5/1994 | DeSimone et al. | | 526/201 |
| 5,313,965 A | 5/1994 | Palen | | 134/61 |
| 5,314,574 A | 5/1994 | Takahashi | | 156/646 |
| 5,316,591 A | 5/1994 | Chao et al. | | 134/34 |
| 5,320,742 A | 6/1994 | Fletcher et al. | | 208/89 |
| 5,328,722 A | 7/1994 | Ghanayem et al. | | 427/250 |
| 5,334,332 A | 8/1994 | Lee | | 252/548 |
| 5,334,493 A | 8/1994 | Fujita et al. | | 430/463 |
| 5,337,446 A | 8/1994 | Smith et al. | | 15/21.1 |
| 5,339,844 A | 8/1994 | Stanford, Jr. et al. | | 134/107 |
| 5,352,327 A | 10/1994 | Witowski | | 156/646 |
| 5,355,901 A | 10/1994 | Mielnik et al. | | 134/105 |
| 5,356,538 A | 10/1994 | Wai et al. | | 210/634 |
| 5,364,497 A | 11/1994 | Chau et al. | | 156/645 |
| 5,368,171 A | 11/1994 | Jackson | | 134/147 |
| 5,370,740 A | 12/1994 | Chao et al. | | 134/1 |
| 5,370,741 A | 12/1994 | Bergman | | 134/3 |
| 5,370,742 A | 12/1994 | Mitchell et al. | | 134/10 |
| 5,377,705 A | 1/1995 | Smith, Jr. et al. | | 134/95.3 |
| 5,401,322 A | 3/1995 | Marshall | | 134/13 |
| 5,403,621 A | 4/1995 | Jackson et al. | | 427/255.1 |
| 5,403,665 A | 4/1995 | Alley et al. | | 428/447 |
| 5,404,894 A | 4/1995 | Shiraiwa | | 134/66 |
| 5,412,958 A | 5/1995 | Iliff et al. | | 68/5 C |
| 5,417,768 A | 5/1995 | Smith, Jr. et al. | | 134/10 |
| 5,433,334 A | 7/1995 | Reneau | | 220/319 |
| 5,447,294 A | 9/1995 | Sakata et al. | | 266/257 |
| 5,456,759 A | 10/1995 | Stanford, Jr. et al. | | 134/1 |
| 5,470,393 A | 11/1995 | Fukazawa | | 134/3 |
| 5,474,812 A | 12/1995 | Truckenmuller et al. | | 427/430.1 |
| 5,482,564 A | 1/1996 | Douglas et al. | | 134/18 |
| 5,486,212 A | 1/1996 | Mitchell et al. | | 8/142 |
| 5,494,526 A | 2/1996 | Paranjpe | | 134/1 |
| 5,500,081 A | 3/1996 | Bergman | | 156/646.1 |
| 5,501,761 A | 3/1996 | Evans et al. | | 156/344 |
| 5,503,176 A | 4/1996 | Dummire et al. | | 137/15 |
| 5,505,219 A | 4/1996 | Lansberry et al. | | 134/105 |
| 5,509,431 A | 4/1996 | Smith, Jr. et al. | | 134/95.1 |
| 5,514,220 A | 5/1996 | Wetmore et al. | | 134/22.18 |
| 5,522,938 A | 6/1996 | O'Brien | | 134/1 |
| 5,526,834 A | 6/1996 | Mielnik et al. | | 134/105 |
| 5,533,538 A | 7/1996 | Marshall | | 134/104.4 |
| 5,547,774 A | 8/1996 | Gimzewski et al. | | 428/694 |
| 5,550,211 A | 8/1996 | DeCrosta et al. | | 528/489 |
| 5,571,330 A | 11/1996 | Kyogoku | | 118/719 |
| 5,580,846 A | 12/1996 | Hayashida et al. | | 510/175 |
| 5,589,082 A | 12/1996 | Lin et al. | | 216/2 |
| 5,589,105 A | 12/1996 | DeSimone et al. | | 252/351 |
| 5,589,224 A | 12/1996 | Tepman et al. | | 427/248.1 |
| 5,618,751 A | 4/1997 | Golden et al. | | 438/392 |
| 5,621,982 A | 4/1997 | Yamashita et al. | | 34/203 |
| 5,629,918 A | 5/1997 | Ho et al. | | 369/112 |
| 5,632,847 A | 5/1997 | Ohno et al. | | 156/344 |

| Patent | Date | Inventor | Class |
|---|---|---|---|
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,644,855 A | 7/1997 | McDermott et al. | 34/516 |
| 5,649,809 A | 7/1997 | Stapelfeldt | 417/63 |
| 5,656,097 A | 8/1997 | Olesen et al. | 134/1 |
| 5,665,527 A | 9/1997 | Allen et al. | 430/325 |
| 5,669,251 A | 9/1997 | Townsend et al. | 68/58 |
| 5,672,204 A | 9/1997 | Habuka | 117/204 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,702,228 A | 12/1997 | Tamai et al. | 414/744.5 |
| 5,706,319 A | 1/1998 | Holtz | 376/203 |
| 5,714,299 A | 2/1998 | Combes et al. | 430/137 |
| 5,725,987 A | 3/1998 | Combes et al. | 430/137 |
| 5,726,211 A | 3/1998 | Hedrick et al. | 521/61 |
| 5,730,874 A | 3/1998 | Wai et al. | 210/638 |
| 5,736,425 A | 4/1998 | Smith et al. | 438/778 |
| 5,739,223 A | 4/1998 | DeSimone | 526/89 |
| 5,746,008 A | 5/1998 | Yamashita et al. | 34/211 |
| 5,766,367 A | 6/1998 | Smith et al. | 134/2 |
| 5,769,588 A | 6/1998 | Toshima et al. | 414/217 |
| 5,783,082 A | 7/1998 | DeSimone et al. | 210/634 |
| 5,797,719 A | 8/1998 | James et al. | 417/46 |
| 5,798,126 A | 8/1998 | Fujikawa et al. | 425/74 |
| 5,798,438 A | 8/1998 | Sawan et al. | 528/483 |
| 5,804,607 A | 9/1998 | Hedrick et al. | 521/64 |
| 5,807,607 A | 9/1998 | Smith et al. | 427/96 |
| 5,817,178 A | 10/1998 | Mita et al. | 118/666 |
| 5,847,443 A | 12/1998 | Cho et al. | 257/632 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,061 A | 2/1999 | Lee et al. | 438/705 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | 417/46 |
| 5,893,756 A | 4/1999 | Berman et al. | 438/692 |
| 5,896,870 A | 4/1999 | Huynh et al. | 134/1.3 |
| 5,898,727 A | 4/1999 | Fujikawa et al. | 373/110 |
| 5,900,107 A | 5/1999 | Murphy et al. | 156/359 |
| 5,900,354 A | 5/1999 | Batchelder | 430/395 |
| 5,904,737 A | 5/1999 | Preston et al. | 8/158 |
| 5,906,866 A | 5/1999 | Webb | 427/534 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,934,856 A | 8/1999 | Asakawa et al. | 414/217 |
| 5,934,991 A | 8/1999 | Rush | 454/187 |
| 5,944,996 A | 8/1999 | DeSimone et al. | 210/634 |
| 5,955,140 A | 9/1999 | Smith et al. | 427/96 |
| 5,965,025 A | 10/1999 | Wal et al. | 210/634 |
| 5,975,492 A | 11/1999 | Brenes | 251/175 |
| 5,976,264 A | 11/1999 | McCullough et al. | 134/2 |
| 5,979,306 A | 11/1999 | Fujikawa et al. | 100/90 |
| 5,980,648 A | 11/1999 | Adler | 134/34 |
| 5,981,399 A | 11/1999 | Kawamura et al. | 438/715 |
| 5,989,342 A | 11/1999 | Ikede et al. | 118/52 |
| 5,992,680 A | 11/1999 | Smith | 220/812 |
| 5,994,696 A | 11/1999 | Tai et al. | 250/288 |
| 6,005,226 A | 12/1999 | Aschner et al. | 219/390 |
| 6,017,820 A | 1/2000 | Ting et al. | 438/689 |
| 6,021,791 A | 2/2000 | Dryer et al. | 134/100.1 |
| 6,024,801 A | 2/2000 | Wallace et al. | 134/1 |
| 6,029,371 A | 2/2000 | Kamikawa et al. | 34/516 |
| 6,035,871 A | 3/2000 | Eui-Yeol | 134/61 |
| 6,037,277 A | 3/2000 | Masakara et al. | 438/787 |
| 6,053,348 A | 4/2000 | Morch | 220/263 |
| 6,056,008 A | 5/2000 | Adams et al. | 137/487.5 |
| 6,063,714 A | 5/2000 | Smith et al. | 438/778 |
| 6,067,728 A | 5/2000 | Farmer et al. | 34/470 |
| 6,077,053 A | 6/2000 | Fujikawa et al. | 417/399 |
| 6,077,321 A | 6/2000 | Adachi et al. | 29/25.01 |
| 6,082,150 A | 7/2000 | Stucker | 68/18 R |
| 6,085,935 A | 7/2000 | Malchow et al. | 220/813 |
| 6,097,015 A | 8/2000 | McCullough et al. | 219/686 |
| 6,099,619 A | 8/2000 | Lansbarkis et al. | 95/118 |
| 6,100,198 A | 8/2000 | Grieger et al. | 438/692 |
| 6,110,232 A | 8/2000 | Chen et al. | 29/25.01 |
| 6,114,044 A | 9/2000 | Houston et al. | 428/447 |
| 6,122,566 A | 9/2000 | Nguyen et al. | 700/218 |
| 6,128,830 A | 10/2000 | Bettcher et al. | 34/404 |
| 6,140,252 A | 10/2000 | Cho et al. | 438/781 |
| 6,145,519 A | 11/2000 | Konishi et al. | 134/95.2 |
| 6,149,828 A | 11/2000 | Vaartstra | 216/57 |
| 6,159,295 A | 12/2000 | Maskara et al. | 118/688 |
| 6,164,297 A | 12/2000 | Kamikawa | 134/61 |
| 6,171,645 B1 | 1/2001 | Smith et al. | 427/96 |
| 6,186,722 B1 | 2/2001 | Shirai | 414/217 |
| 6,200,943 B1 | 3/2001 | Romack et al. | 510/285 |
| 6,203,582 B1 | 3/2001 | Berner et al. | 29/25.01 |
| 6,216,364 B1 | 4/2001 | Tanaka et al. | 34/448 |
| 6,224,774 B1 | 5/2001 | DeSimone et al. | 210/634 |
| 6,228,563 B1 | 5/2001 | Starov et al. | 430/327 |
| 6,228,826 B1 | 5/2001 | DeYoung et al. | 510/291 |
| 6,232,238 B1 | 5/2001 | Chang et al. | 438/725 |
| 6,232,417 B1 | 5/2001 | Rhodes et al. | 526/171 |
| 6,235,634 B1 | 5/2001 | White et al. | 438/680 |
| 6,239,038 B1 | 5/2001 | Wen | 438/745 |
| 6,241,825 B1 | 6/2001 | Wytman | 118/733 |
| 6,242,165 B1 | 6/2001 | Vaartstra | 430/329 |
| 6,244,121 B1 | 6/2001 | Hunter | 73/865.9 |
| 6,251,250 B1 | 6/2001 | Keigler | 205/89 |
| 6,255,732 B1 | 7/2001 | Yokoyama et al. | 257/760 |
| 6,270,531 B1 | 8/2001 | DeYoung et al. | 8/142 |
| 6,270,948 B1 | 8/2001 | Sato et al. | 430/314 |
| 6,277,753 B1 * | 8/2001 | Mullee et al. | 438/692 |
| 6,284,558 B1 | 9/2001 | Sakamoto | 438/30 |
| 6,286,231 B1 | 9/2001 | Bergman et al. | 34/410 |
| 6,305,677 B1 | 10/2001 | Lenz | 269/13 |
| 6,306,564 B1 | 10/2001 | Mullee | 430/329 |
| 6,319,858 B1 | 11/2001 | Lee et al. | 438/787 |
| 6,331,487 B2 | 12/2001 | Koch | 438/692 |
| 6,334,266 B1 | 1/2002 | Moritz et al. | 34/337 |
| 6,344,174 B1 | 2/2002 | Miller et al. | 422/98 |
| 6,344,243 B1 | 2/2002 | McClain et al. | 427/388.1 |
| 6,355,072 B1 | 3/2002 | Racette et al. | 8/142 |
| 6,358,673 B1 | 3/2002 | Namatsu | 430/311 |
| 6,361,696 B1 | 3/2002 | Spiegelman et al. | 210/662 |
| 6,367,491 B1 | 4/2002 | Marshall et al. | 134/104.4 |
| 6,380,105 B1 | 4/2002 | Smith et al. | 438/778 |
| 6,388,317 B1 | 5/2002 | Reese | 257/713 |
| 6,389,677 B1 | 5/2002 | Lenz | 29/559 |
| 6,418,956 B1 | 7/2002 | Bloom | 137/14 |
| 6,425,956 B1 | 7/2002 | Cotte et al. | 134/3 |
| 6,436,824 B1 | 8/2002 | Chooi et al. | 438/687 |
| 6,451,510 B1 | 9/2002 | Messick et al. | 430/311 |
| 6,454,519 B1 | 9/2002 | Toshima et al. | 414/805 |
| 6,454,945 B1 | 9/2002 | Weigl et al. | 210/634 |
| 6,458,494 B2 | 10/2002 | Song et al. | 430/5 |
| 6,461,967 B2 | 10/2002 | Wu et al. | 438/705 |
| 6,464,790 B1 | 10/2002 | Sherstinsky et al. | 118/715 |
| 6,465,403 B1 | 10/2002 | Skee | 510/175 |
| 6,472,334 B2 | 10/2002 | Ikakura et al. | 438/778 |
| 6,478,035 B1 | 11/2002 | Niuya et al. | |
| 6,479,407 B2 | 11/2002 | Yokoyama et al. | 438/788 |
| 6,485,895 B1 | 11/2002 | Choi et al. | 430/330 |
| 6,486,078 B1 | 11/2002 | Rangarajan et al. | 438/778 |
| 6,487,792 B2 | 12/2002 | Sutton et al. | |

| | | | |
|---|---|---|---|
| 6,487,994 B2 | 12/2002 | Ahern et al. | |
| 6,492,090 B2 | 12/2002 | Nishi et al. | 430/270.1 |
| 6,500,605 B1 | 12/2002 | Mullee et al. | 430/329 |
| 6,503,837 B2 | 1/2003 | Chiou | 438/691 |
| 6,508,259 B1 | 1/2003 | Tseronis et al. | 134/105 |
| 6,509,136 B1 | 1/2003 | Goldfarb et al. | 430/272.1 |
| 6,509,141 B2 | 1/2003 | Mullee | 430/329 |
| 6,520,767 B1 | 2/2003 | Ahern et al. | |
| 6,521,466 B1 | 2/2003 | Castrucci | 438/5 |
| 6,537,916 B2 | 3/2003 | Mullee et al. | 438/692 |
| 6,541,278 B2 | 4/2003 | Morita et al. | 438/3 |
| 6,546,946 B2 | 4/2003 | Dunmire | 137/15.18 |
| 6,550,484 B1 | 4/2003 | Gopinath et al. | 134/1.2 |
| 6,554,507 B2 | 4/2003 | Namatsu | 396/611 |
| 6,558,475 B1 | 5/2003 | Jur et al. | 134/21 |
| 6,561,213 B2 | 5/2003 | Wang et al. | 137/263 |
| 6,561,220 B2 | 5/2003 | McCullough et al. | 137/565.12 |
| 6,561,481 B1 | 5/2003 | Filonczuk | 251/129.12 |
| 6,561,767 B2 | 5/2003 | Berger et al. | 417/53 |
| 6,561,774 B2 | 5/2003 | Layman | |
| 6,562,146 B1 | 5/2003 | DeYoung et al. | 134/30 |
| 6,564,826 B2 | 5/2003 | Shen | 137/505.18 |
| 6,576,138 B2 | 6/2003 | Sateria et al. | 210/664 |
| 6,583,067 B2 | 6/2003 | Chang et al. | 438/723 |
| 6,596,093 B2 | 7/2003 | DeYoung et al. | 134/36 |
| 6,613,157 B2 | 9/2003 | DeYoung et al. | 134/36 |
| 6,623,355 B2 | 9/2003 | McClain et al. | 457/60 |
| 6,635,565 B2 | 10/2003 | Wu et al. | 438/637 |
| 6,635,582 B2 | 10/2003 | Yun et al. | 438/745 |
| 6,641,678 B2 | 11/2003 | DeYoung et al. | 134/36 |
| 6,656,666 B2 | 12/2003 | Simons et al. | 430/322 |
| 6,669,916 B2 | 12/2003 | Heim et al. | 423/245.1 |
| 6,673,521 B2 | 1/2004 | Moreau et al. | 430/315 |
| 6,677,244 B2 | 1/2004 | Ono et al. | 438/706 |
| 6,685,903 B2 | 2/2004 | Wong et al. | 423/262 |
| 6,722,642 B1 | 4/2004 | Sutton et al. | |
| 6,736,149 B2 | 5/2004 | Biberger et al. | |
| 6,737,725 B2 | 5/2004 | Grill et al. | 257/522 |
| 6,748,960 B1 | 6/2004 | Biberger et al. | |
| 6,748,966 B1 | 6/2004 | Dvorak | 137/216 |
| 6,764,552 B1* | 7/2004 | Joyce et al. | 134/3 |
| 6,777,312 B2 | 8/2004 | Yang et al. | 438/464 |
| 6,780,765 B2 | 8/2004 | Goldstein | 438/660 |
| 6,802,961 B2 | 10/2004 | Jackson | 210/86 |
| 6,852,194 B2 | 2/2005 | Matsushita et al. | |
| 6,871,656 B2 | 3/2005 | Mullee | |
| 6,890,853 B2 | 5/2005 | Biberger et al. | |
| 6,921,456 B2 | 7/2005 | Biberger et al. | |
| 6,924,086 B1 | 8/2005 | Arena-Foster et al. | |
| 6,926,012 B2 | 8/2005 | Biberger et al. | |
| 6,926,798 B2 | 8/2005 | Biberger et al. | |
| 6,928,746 B2 | 8/2005 | Arena-Foster et al. | |
| 6,953,654 B2 | 10/2005 | Ryza et al. | |
| 2002/0001929 A1 | 1/2002 | Biberger et al. | 438/584 |
| 2002/0046707 A1 | 4/2002 | Biberger et al. | 156/345 |
| 2002/0117391 A1 | 8/2002 | Beam | 203/81 |
| 2002/0189543 A1 | 12/2002 | Biberger et al. | 118/715 |
| 2003/0003762 A1 | 1/2003 | Cotte et al. | 438/745 |
| 2003/0013311 A1 | 1/2003 | Chang et al. | 438/704 |
| 2003/0047533 A1 | 3/2003 | Reid et al. | 216/24 |
| 2003/0106573 A1 | 6/2003 | Masuda et al. | 134/26 |
| 2003/0125225 A1 | 7/2003 | Xu et al. | 510/175 |
| 2003/0196679 A1 | 10/2003 | Cotte et al. | 134/1 |
| 2003/0198895 A1 | 10/2003 | Toma et al. | |
| 2003/0202792 A1 | 10/2003 | Goshi | |
| 2004/0011386 A1 | 1/2004 | Seghal | |
| 2004/0020518 A1 | 2/2004 | DeYoung et al. | 134/30 |
| 2004/0040660 A1 | 3/2004 | Biberger et al. | 156/345.31 |
| 2004/0045588 A1 | 3/2004 | DeYoung et al. | 134/26 |
| 2004/0087457 A1 | 5/2004 | Korzenski et al. | 510/177 |
| 2004/0091813 A1* | 5/2004 | Poss et al. | 430/270.1 |
| 2004/0103922 A1 | 6/2004 | Inoue et al. | 134/26 |
| 2004/0112409 A1 | 6/2004 | Schilling | |
| 2004/0134515 A1* | 7/2004 | Castrucci | 134/2 |
| 2004/0136770 A1* | 7/2004 | Muhr-Sweeney | 401/23 |
| 2004/0157463 A1 | 8/2004 | Jones | 438/716 |
| 2004/0177867 A1 | 9/2004 | Schilling | 134/26 |
| 2004/0211440 A1* | 10/2004 | Wang et al. | 134/2 |
| 2004/0221871 A1* | 11/2004 | Fletcher et al. | 134/6 |
| 2004/0259357 A1 | 12/2004 | Saga | |
| 2004/0261710 A1 | 12/2004 | Matsushita et al. | |
| 2005/0077597 A1 | 4/2005 | Toma et al. | |
| 2005/0158477 A1 | 7/2005 | Vezin et al. | |
| 2005/0203789 A1 | 9/2005 | Kauffman et al. | |
| 2005/0215072 A1 | 9/2005 | Kevwitch et al. | |
| 2005/0216228 A1 | 9/2005 | Kauffman et al. | |
| 2006/0003592 A1 | 1/2006 | Gale et al. | |
| 2006/0102204 A1 | 5/2006 | Jacobson et al. | |

FOREIGN PATENT DOCUMENTS

| | | |
|---|---|---|
| CN | 1399790 A | 2/2003 |
| DE | 36 08 783 A1 | 9/1987 |
| DE | 39 04 514 C2 | 3/1990 |
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| DE | 198 60 084 A1 | 7/2000 |
| EP | 0 244 951 A2 | 11/1987 |
| EP | 02 72 141 A2 | 6/1988 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 587 168 A1 | 3/1994 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| EP | 0 829 312 A2 | 3/1998 |
| EP | 0 836 895 A2 | 4/1998 |
| EP | 0 903 775 A2 | 3/1999 |
| FR | 1 499 491 | 9/1967 |
| GB | 2 003 975 | 3/1979 |
| GB | 2 193 482 | 2/1988 |
| JP | 60-192333 | 9/1985 |
| JP | 60-2348479 | 11/1985 |
| JP | 60-246635 | 12/1985 |
| JP | 61-017151 | 1/1986 |
| JP | 61-231166 | 10/1986 |
| JP | 62-111442 | 5/1987 |
| JP | 62-099619 | 6/1987 |
| JP | 63-256326 | 10/1988 |
| JP | 63-303059 | 12/1988 |
| JP | 1-045131 | 2/1989 |
| JP | 1-246835 | 10/1989 |
| JP | 2-148841 | 6/1990 |
| JP | 2-209729 | 8/1990 |
| JP | 2-304941 | 12/1990 |
| JP | 4-284648 | 10/1992 |
| JP | 7-142333 | 6/1995 |
| JP | 8-186140 A | 7/1996 |
| JP | 8-222508 A | 8/1996 |
| JP | 10-144757 A | 5/1998 |
| JP | 56-142629 | 11/1998 |
| JP | 10335408 A | 12/1998 |
| JP | 11-200035 | 7/1999 |

| JP | 2000-106358 | 4/2000 |
| --- | --- | --- |
| WO | WO 87/07309 | 12/1987 |
| WO | WO 90/06189 | 6/1990 |
| WO | WO 90/13675 | 11/1990 |
| WO | WO 91/12629 A | 8/1991 |
| WO | WO 93/14255 | 7/1993 |
| WO | WO 93/14259 | 7/1993 |
| WO | WO 93/20116 | 10/1993 |
| WO | WO 96/277704 | 9/1996 |
| WO | WO 99/18603 A | 4/1999 |
| WO | WO 99/49998 | 10/1999 |
| WO | WO 00/36635 | 6/2000 |
| WO | WO 00/73241 A1 | 12/2000 |
| WO | WO 01/10733 A1 | 2/2001 |
| WO | WO 01/33613 A2 | 5/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A2 | 12/2001 |
| WO | WO 02/09894 A2 | 2/2002 |
| WO | WO 02/11191 A2 | 2/2002 |
| WO | WO 02/15251 A1 | 2/2002 |
| WO | WO 02/16051 A2 | 2/2002 |
| WO | WO03064065 A1 | 8/2003 |
| WO | WO 03/030219 A2 | 10/2003 |
| WO | 2004008249 A2 | 1/2004 |

OTHER PUBLICATIONS

Holleman. A Text-book of Organic Chemistry. 1920. p. 449.*
Weibel et al., An Overview of Supercritical CO2 Applications in Microelectronics Processing; Microelectronic Engineering, Jan. 2003, pp. 145-152, vol. 65, No. 1-2, Elsevier Publishers BV, Amsterdam, NL.
European Patent Office, International Search Report and Written Opinion for PCT/US2006/017294, Oct. 18, 2006, 10 pp.
Jones et al., *HF Etchant Solutions in Supercritical Carbon Dioxide for "Dry" Etch Processing of Microelectronic Devices*, Chem Mater., vol. 15, 2003, pp. 2867-2869.
Gangopadhyay et al., *Supercritical $CO_2$ Treatments for Semiconductor Applications*, Mat. Res. Soc. Symp. Proc., vol. 812, 2004, pp. F4.6.1-F4.6.6.
European Patent Office, *International Search Report*, PCT/US2005/013885, Oct. 24, 2005, 4 pp.
J. B. Rubin et al, *A Comparison of Chilled DI Water/Ozone and $CO_2$-based Supercritical Fluids as Replacements for Photoresist-Stripping Solvents*, IEEE/CPMT Int'l Electronics Manufacturing Technology Symposium, pp. 308-314, 1998.
*Los Alamos National Laboratory*, Solid State Technology, pp. S10 & S14, Oct. 1998.
*Supercritical Carbon Dioxide Resist Remover, SCORR, the Path to Least Photoresistance*, Los Alamos National Laboratory, 1998.
Z. Guan et al., *Fluorocarbon-Based Heterophase Polymeric Materials. I. Block Copolymer Surfactants for Carbon Dioxide Applications*, Macromolecules, vol. 27, pp. 5527-5532, 1994.
*International Journal of Environmetally Conscious Design & Manufacturing*, vol. 2, No. 1, pp. 83, 1993.
Matson and Smith, *Supercritical Fluids*, Journal of the American Ceramic Society, vol. 72, No. 6, pp. 872-874.
D. H. Ziger et al., *Compressed Fluid Technology; Application to RIE Developed Resists*, AIChE Journal, vol. 33, No. 10, pp. 1585-1591, Oct. 1987.
Kirk-Othmer, *Alcohol Fuels to Toxicology*, Encyclopedia of Chemical Terminology, 3rd ed., Supplement Volume, New York: Johh Wiley & Sons, pp. 872-893, 1984.
*Cleaning with Supercritical $CO_2$*, NASA Tech Briefs, MFS-29611, Marshall Space Flight Center, Alabama, Mar. 1979.
N. Basta, *Supercritical Fluids: Still Seeking Acceptance*, Chemical Engineering vol. 92, No. 3, pp. 14, Feb. 24, 1985.

D. Takahashi, *Los Alamos Lab Finds Way to Cut Chip Toxic Waste*, Wall Street Journal, Jun. 22, 1998.
*Supercritical $CO_2$ Process Offers Less Mess from Semiconductor Plants*, Chemical Engineering Magazine, pp. 27 & 29, Jul. 1988.
Y. P. Sun, *Preparation of Polymer Protected Semiconductor Nanoparticles Through the Rapid Expansion of Supercritical Fluid Solution*, Chemical Physics Letters, pp. 585-588, May 22, 1998.
K. Jackson et al., *Surfactants and Micromulsions in Supercritical Fluids*, Supercritical Fluid Cleaning, Noyes Publications, Westwood, NJ, pp. 87-120, Spring 1998.
M. Kryszcwski, *Production of Metal and Semiconductor Nanoparticles in Polymer Systems*, Polimery, pp. 65-73, Feb. 1998.
G. L. Bakker et al., *Surface Cleaning and Carbonaceous Film Removal Using High Pressure, High Temperature Water, and Water/$Co_2$ Mixtures*, J Electrochem Soc., vol. 145, No. 1, pp. 284-291, Jan. 1998.
C. K. Ober et al., *Imaging Polymers with Supercritical Carbon Dioxide*, Advanced Materials, vol. 9, No. 13, pp. 1039-1043, Nov. 3, 1997.
E. M. Russick et al., *Supercritical Carbon Dioxide Extraction of Solvent from Micro-Machined Structures*, Supercritical Fluids Extraction and Pollution Prevention, ACS Symposium Series, vol. 670, pp. 255-269, Oct. 21,1997.
N. Dahmen et al., *Supercritical Fluid Extraction of Grinding and Metal Cutting Waste Contaminated with Oils*, Supercritical Fluids—Extraction and Pollution Prevention, ACS Symposium Series, vol. 670, pp. 270-279, Oct. 21, 1997.
C. M. Wal, *Supercritical Fluid Extraction: Metals as Complexes*, Journal of Chromatography A, vol. 785, pp. 369-383, Oct. 17, 1997.
C. Xu et al., *Submicron-Sized Spherical Yttrium Oxide Based Phosphors Prepared by Supercritical $CO_2$-Assisted Nerosolization and Pyrolysis*, Appl. Phys. Lett., vol. 71, No. 22, pp. 1643-1645, Sep. 22, 1997.
Y. Tomioka et al., *Decomposition of Tetramethylammonium (TMA) in a Positive Photo-resist Developer by Supercritical Water*, Abstracts of Papers 214th ACS Natl Meeting, American Chemical Society, Abstract No. 108, Sep. 7,1997.
H. Klein et al., *Cyclic Organic Carbonates Serve as Solvents and Reactive Diluents*, Coatings World, pp. 38-40, May 1997.
J. Bühler et al., *Linear Array of Complementary Metal Oxide Semiconductor Double-Pass Metal Micro-mirrors*, Opt. Eng. vol. 36, No. 5, pp. 1391-1398, May 1997.
M. H. Jo et al., *Evaluation of $SiO_2$ Aerogel Thin Film with Ultra Low Dielectric Constant as an Intermetal Dielectric*, Microelectronic Engineering, vol. 33, pp. 343-348, Jan. 1997.
J. B. McClain et al., *Design of Nonionic Surfactants for Supercritical Carbon Dioxide*, Science, vol. 274, pp. 2049-2052, Dec. 20, 1996.
L. Znaidi et al., *Batch and Semi-Continuous Synthesis of Magnesium Oxide Powders from Hydrolysis and Supercritical Treatment of Mg $(OCH_3)_2$*, Materials Research Bulletin, vol. 31, No. 12, pp. 1527-1535, Dec. 1996.
M. E. Tardros, *Synthesis of Titanium Dioxide Particles in Supercritical $CO_2$*, J. Supercritical Fluids, vol. 9, pp. 172-176, Sep. 1996.
V. G. Courtecuisse et al., *Kinetics of the Titanium Isopropoxide Decomposition in Supercritical Isopropyl Alcohol*, Ind. Eng. Chem. Res., vol. 35, No. 8, pp. 2539-2545, Aug. 1996.
A. Garbor et al., *Block and Random Copolymer Resists Designed for 193 nm Lithography and Environmentally Friendly Supercritical $CO_2$ Development*, SPIE, vol. 2724, pp. 410-417, Jun. 1996.
G. L. Schimek et al., *Supercritical Ammonia Synthesis and Characterization of Four New Alkali Metal Silver Antimony Sulfides . . .* , J. Solid State Chemistry, vol. 123, pp. 277-284, May 1996.
P. Gallagher-Wetmore et al., *Supercritical Fluid Processing: Opportunities for New Resist Materials and Processes*, SPIE, vol. 2725, pp. 289-299, Apr. 1996.
K. I. Papathomas et al., *Debonding of Photoresists by Organic Solvents*, J. Applied Polymer Science, vol. 59, pp. 2029-2037, Mar. 28, 1996.
J. J. Watkins et al., *Polymer/Metal Nanocomposite Synthesis in Supercritical $CO_2$*, Chemistry of Materials, vol. 7, No. 11, pp. 1991-1994, Nov. 1995.
E. F. Gloyna et al., *Supercritical Water Oxidation Research and Development Update*, Environmental Progress, vol. 14, No. 3, pp. 182-192, Aug. 1995.

P. Gallagher-Wetmore et al., *Supercritical Fluid Processing: A New Dry Technique for Photoresist Developing*, SPIE, vol. 2438, pp. 694-708, Jun. 1995.

A. H. Gabor et al., *Silicon-Containing Block Copolymer Resist Materials*, Microelectronics Technology—Polymers for Advanced Imaging and Packaging, ACS Symposium Series, vol. 615, pp. 281-298, Apr. 1995.

P. C. Tsiartas et al., *Effect of Molecular Weight Distribution on the Dissolution Properties of Novolac Blends*, SPIE, vol. 2438, pp. 264-271, Jun. 1995.

R. D. Allen et al., *Performance Properties of Near-Monodisperse Novolak Resins*, SPIE, vol. 2438, pp. 250-260, Jun. 1995.

P. T. Wood et al., *Synthesis of New Channeled Structures in Supercritical Amines...*, Inorg. Chem., vol. 33, pp. 1556-1558, 1994.

J. B. Jerome et al., *Synthesis of New Low-Dimensional Quaternary Compounds...*, Inorg. Chem., vol. 33, pp. 1733-1734, 1994.

J. McHardy et al., *Progress in Supercritical $CO_2$ Cleaning*, SAMPE Jour, vol. 29, No. 5, pp. 20-27, Sep. 1993.

R. Purtell et al., *Precision Parts Cleaning Using Supercritical Fluids*, J. Vac. Sci. Technol. A., vol. 11, No. 4, pp. 1696-1701, Jul. 1993.

E. Bok et al., *Supercritical Fluids for Single Wafer Cleaning*, Solid State Technology, pp. 117-120, Jun. 1992.

T. Adschirl et al., *Rapid and Continuous Hydrothermal Crystallization of Metal Oxide Particles in Supercritical Water*, J. Am. Ceram. Cos., vol. 75, No. 4, pp. 1019-1022, 1992.

B. N. Jacobson et al., *Supercritical Fluid Transport—Chemical Deposition of Films*, Chem. Mater, vol. 4, No. 4, pp. 749-752, 1992.

S. H. Page et al., *Predictability and Effect of Phase Behavior of $Co_2$/Propylene Carbonate in Supercritical Fluid Chromatography*, J. Microcol, vol. 3, No. 4, pp. 355-369, 1991.

T. Brokamp et al., *Synthese und Kristallstruktur Elnes Gemischtvalenten Lithium-Tantalnitride $Li_2Ta_3N_5$*, J. Alloys and Compounds, vol. 176, pp. 47-60, 1991.

B. M. Hybertson et al., *Deposition of Palladium Films by a Novel Supercritical Transport Chemical Deposition Process*, Mat. Res. Bull., vol. 26, pp. 1127-1133, 1991.

D. H. Ziger et al., *Compressed Fluid Technology: Application to RIE Developed Resists*, AIChE Journal, vol. 33, No. 10, pp. 1585-1591, Oct. 1987.

D. W. Matson et al., *Rapid Expansion of Supercritial Fluid Solutions: Solute Formation of Powders, Thin Films, and Fibers*, Ind. Eng. Chem. Res., vol. 26, No. 11, pp. 2298-2306, 1987.

W. K. Tolley et al., *Stripping Organics from Metal and Mineral Surfaces Using Supercritical Fluids*, Separation Science and Technology, vol. 22, pp. 1087-1101, 1987.

*Final Report on the Safety Assessment of Propylene Carbonate*, J. American College of Toxicology, vol. 6, No. 1, pp. 23-51, 1987.

*Porous Xerogel Films as Ultra-Low Permittivity Dielectrics for ULSI Interconnect Applications*, Materials Research Society, pp. 463-469, 1987.

Kawakami et al., *A Super Low-k(k=1.1) Silica Aerogel Film Using Supercritical Drying Technique*, IEEE, pp. 143-145, 2000.

R. F. Reidy, *Effects of Supercritical Processing on Ultra Low-k Films*, Texas Advanced Technology Program, Texas Instruments and the Texas Academy of Mathematics and Science.

Anthony Muscat, *Backend Processing Using Supercritical $CO_2$*, University of Arizona.

D. Goldfarb et al., *Aqueous-based Photoresist Drying Using Supercritical Carbon Dioxide to Prevent Pattern Collapse*, J. Vacuum Sci. Tech. B, vol. 18, No. 6, pp. 3313, 2000.

H. Namatsu et al., *Supercritical Drying for Water-Rinsed Resist Systems*, J. Vacuum Sci. Tech. B, vol. 18, No. 6, pp. 3308, 2000.

N. Sundararajan et al., *Supercritical $CO_2$ Processing for Submicron Imaging of Fluoropolymers*, Chem. Mater., vol. 12, 41, 2000.

Hideaki Itakura et al., *Multi-Chamber Dry Etching System*, Solid State Technology, pp. 209-214, Apr. 1982.

Joseph L. Foszez, *Diaphragm Pumps Eliminate Seal Problems*, Plant Engineering, pp. 1-5, Feb. 1, 1996.

Bob Agnew, *WILDEN Air-Operated Diaphragm Pumps*, Process & Industrial Training Technologies, Inc., 1996.

Taiwanese Patent Office, Official Action issued for related Taiwan Patent Application No. 095116684 dated Jul. 17, 2009, 7 pp.

\* cited by examiner

TREATMENT OF SUBSTRATE USING FUNCTIONALIZING AGENT IN SUPERCRITICAL CARBON DIOXIDE

CROSS-REFERENCE TO RELATED APPLICATIONS

This patent application is related to commonly owned co-pending U.S. patent application Ser. No. 10/908,396, filed May 10, 2005 entitled "Removal of Particles from Substrate Surfaces Using Supercritical Processing," which is hereby incorporated by reference in its entirety.

FIELD OF THE INVENTION

This invention relates to the field of processing substrates using supercritical carbon dioxide. More particularly, the present invention relates to the field of processing porous low-k dielectric materials using supercritical carbon dioxide processes.

BACKGROUND OF THE INVENTION

Carbon dioxide ($CO_2$) is an environmentally friendly, naturally abundant, non-polar molecule. Being non-polar, $CO_2$ has the capacity to dissolve a variety of non-polar materials or contaminates. The degree to which the contaminants found in non-polar $CO_2$ are soluble is dependant on the physical state of the $CO_2$. The four phases of $CO_2$ are solid, liquid, gas, and supercritical. The four phases or states are differentiated by appropriate combinations of specific pressures and temperatures. $CO_2$ in a supercritical state (sc-$CO_2$) is neither liquid nor gas but embodies properties of both. In addition, sc-$CO_2$ lacks any meaningful surface tension while interacting with solid surfaces, and hence, can readily penetrate high aspect ratio geometrical features more readily than liquid $CO_2$. Moreover, because of its low viscosity and liquid-like characteristics, the sc-$CO_2$ can easily dissolve large quantities of many other chemicals. It has been shown that as the temperature and pressure are increased into the supercritical phase, the solubility of $CO_2$ also increases. This increase in solubility has lead to the development of a number of sc-$CO_2$ cleaning processes.

One problem in semiconductor manufacturing is that the cleaning process sometimes does not completely remove photoresist residue and other residues and contaminants on the surface of the wafer. For example, during some cleaning processes, oxidized residues can be created that adversely affect the cleaning process. It would be advantageous during the cleaning process to be able to remove both oxidized and non-oxidized residues and/or contaminants from the surface features on the wafer surface.

What is needed is an improved method for removing oxidized and/or partially oxidized residues from substrate surfaces.

SUMMARY OF THE INVENTION

In accordance with the present invention, a method of processing a substrate is provided, the method comprising positioning the substrate on a substrate holder in a processing chamber; performing a cleaning process using a first supercritical fluid comprising supercritical $CO_2$ and a cleaning chemistry; and thereafter performing a treatment process using a second supercritical fluid comprising supercritical $CO_2$ and one or more functionalizing agents selected from an acyl halide, an alkyl halide, or an acyl alcohol, or a combination thereof.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

The present invention is directed to processing substrates using supercritical carbon dioxide. In one embodiment, the substrate includes a patterned low-k and/or ultra low-k material thereon. In accordance with the method of the present invention, the substrate is cleaned using a first supercritical fluid comprising supercritical $CO_2$ and a cleaning chemistry. For example, the cleaning chemistry may comprise an acid and a solvent, such as an organic acid and an alcohol or ketone solvent. In one embodiment, the cleaning process can be an oxidation process and/or an etching process effective to oxidize or partially oxidize the substrate surface, such as the patterned dielectric material, and can remove at least a portion thereof, but some small fragments of oxidized residue are only minimally soluble in supercritical $CO_2$, and may thus be left behind.

After the cleaning process, and in further accordance with the present invention, the substrate is treated using a second supercritical fluid comprising supercritical $CO_2$ and one or more functionalizing agents selected from an acyl halide, an alkyl halide, and/or an acyl alcohol. In one embodiment, the functionalizing agent is effective to render small fragments of oxidized residue more soluble in supercritical $CO_2$ to thereby enable removal of the fragments during the treatment process.

Thus, the method of the present invention includes at least a cleaning process and a treatment process, wherein the treatment process includes a functionalizing agent effective to remove surface matter, such as particulate, contaminants, and/or residues, not removed during the cleaning process, such as by rendering the un-removed matter more soluble in the supercritical $CO_2$. The invention should not be considered limited to only the cleaning and treatment steps. Other method steps may be performed prior to the cleaning process, after the treatment process, and/or between the cleaning and treatment processes. Further, individual steps and/or combinations of steps may be repeated any desired number of times.

Figure 1:
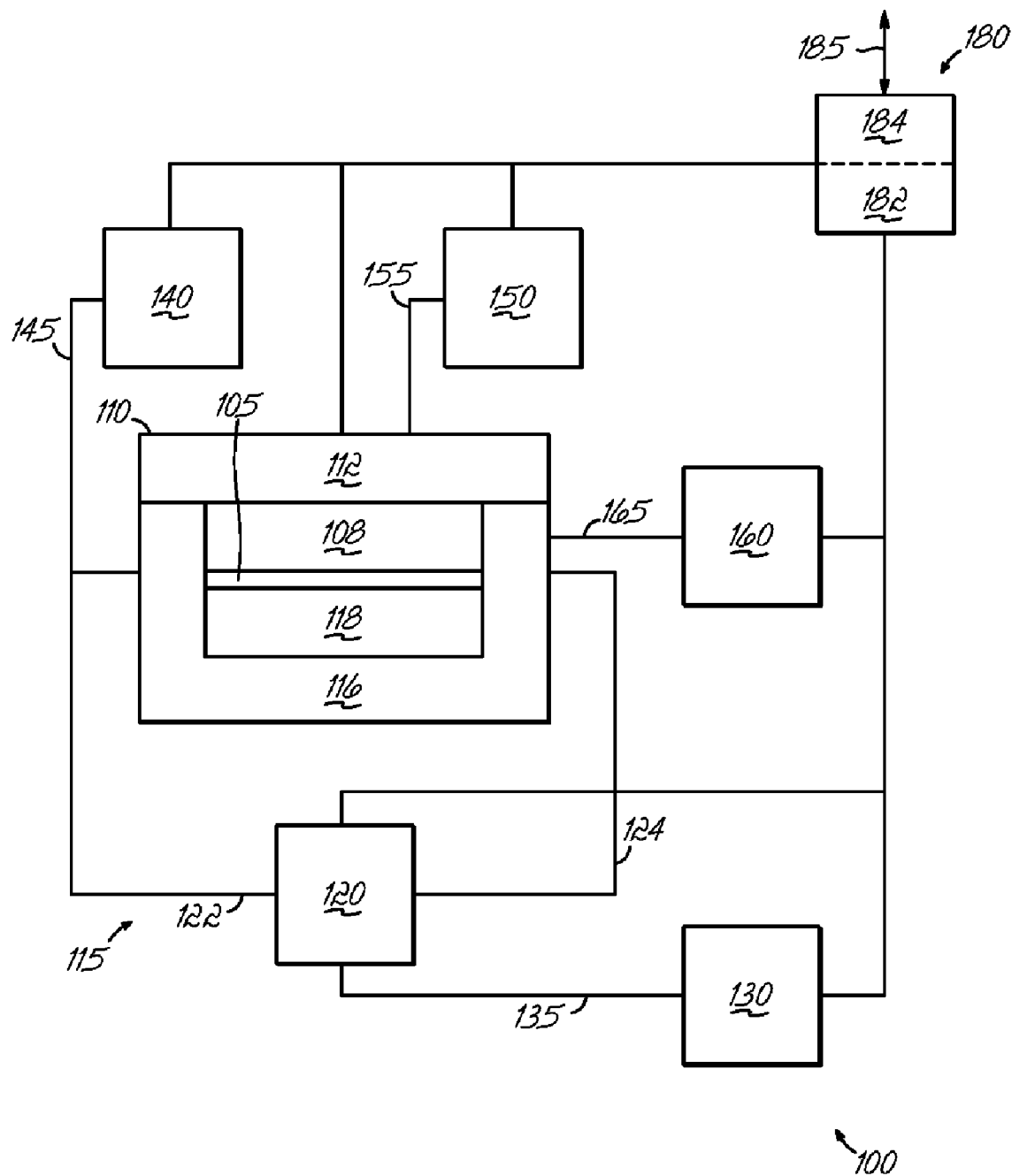
FIG. 1 shows an exemplary block diagram of a processing system in accordance with embodiments of the invention.

The present invention will now be explained further by reference to the Figures. FIG. 1 shows an exemplary block diagram of a processing system in accordance with embodiments of the invention. In the illustrated embodiment, processing system 100 comprises a process module 110 including a process chamber 108 for processing a substrate 105, a recirculation system 120, a process chemistry supply system 130, a high-pressure fluid supply system 140, a pressure control system 150, an exhaust system 160, and a controller 180. The processing system 100 can operate at pressures that can range from 1000 psi to 10,000 psi. In addition, the processing system 100 can operate at temperatures that can range from 40 to 300 degrees Celsius.

The details concerning one example of a processing chamber are disclosed in co-owned and co-pending U.S. patent application Ser. No. 09/912,844, entitled "High Pressure Processing Chamber for Semiconductor Substrate," filed Jul. 24, 2001; U.S. patent application Ser. No. 09/970,309, entitled "High Pressure Processing Chamber for Multiple Semiconductor Substrates," filed Oct. 3, 2001; U.S. patent application Ser. No. 10/121,791, entitled "High Pressure Processing Chamber for Semiconductor Substrate Including Flow Enhancing Features," filed Apr. 10, 2002; and U.S. patent application Ser. No. 10/364,284, entitled "High-Pressure Processing Chamber for a Semiconductor Wafer," filed Feb. 10, 2003, the contents of which are incorporated herein by reference.

The controller 180 can be coupled to the process module 110, the recirculation system 120, the process chemistry supply system 130, the high-pressure fluid supply system 140, the pressure control system 150, and the exhaust system 160. Alternately, controller 180 can be coupled to one or more additional controllers/computers (not shown), and controller 180 can obtain setup, configuration, and/or recipe information from an additional controller/computer.

In FIG. 1, singular processing elements (110, 120, 130, 140, 150, 160, and 180) are shown, but this is not required for the invention. The semiconductor processing system 100 can comprise any number of processing elements having any number of controllers associated with them in addition to independent processing elements.

The controller 180 can be used to configure any number of processing elements (110, 120, 130, 140, 150, and 160), and the controller 180 can collect, provide, process, store, and display data from processing elements. The controller 180 can comprise a number of applications for controlling one or more of the processing elements. For example, controller 180 can include a graphic user interface (GUI) component (not shown) that can provide easy to use interfaces that enable a user to monitor and/or control one or more processing elements.

The process module 110 can include a processing chamber 108 enclosed by an upper assembly 112 and a lower assembly 116, and the upper assembly 112 can be coupled to the lower assembly 116. In an alternate embodiment, a frame and or injection ring may be included and may be coupled to an upper assembly and a lower assembly. The upper assembly 112 can comprise a heater (not shown) for heating the processing chamber 108, a substrate 105 in the processing chamber 108, or the processing fluid, or a combination of two or more thereof. Alternately, a heater is not required in the upper assembly 112. In another embodiment, the lower assembly 116 can comprise a heater (not shown) for heating the processing chamber 108, the substrate 105, or the processing fluid, or a combination of two or more thereof. The process module 110 can include means for flowing a processing fluid through the processing chamber 108. In one example, a circular flow pattern can be established, and in another example, a substantially linear flow pattern can be established. Alternately, the means for flowing can be configured differently.

In one embodiment, the process module 110 can include a holder or chuck 118 for supporting and holding the substrate 105 while processing the substrate 105. The lower assembly 116 can comprise one or more lifters (not shown) for moving the chuck 118 and/or the substrate 105. Alternately, a lifter is not required. The holder or chuck 118 can also be configured to heat or cool the substrate 105 before, during, and/or after processing the substrate 105. Alternately, the process module 110 can include a platen for supporting and holding the substrate 105 while processing the substrate 105.

A transfer system (not shown) can be used to move a substrate 105 into and out of the processing chamber 108 through a slot (not shown). In one example, the slot can be opened and closed by moving the chuck 118, and in another example, the slot can be controlled using a gate valve.

The substrate 105 can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, Ta, or W, or combinations of two or more thereof. The dielectric material can include Si, O, N, or C, or combinations of two or more thereof. The ceramic material can include Al, N, Si, C, or O, or combinations of two or more thereof. In one embodiment, the substrate includes a patterned dielectric material, for example a low-k material or an ultra low-k material or combination thereof.

The recirculation system 120 can be coupled to the process module 110 using one or more inlet lines 122 and one or more outlet lines 124 to form a recirculation loop 115. The recirculation system 120 can comprise one or more valves (not shown) for regulating the flow of a supercritical processing solution through the recirculation system 120 and through the process module 110. The recirculation system 120 can comprise any number of back-flow valves, filters, pumps, and/or heaters (not shown) for maintaining a supercritical processing solution and flowing the supercritical processing solution through the recirculation system 120 and through the processing chamber 108 in the process module 110. After introducing a fluid to the processing chamber 108, the fluid can be recirculated through the processing chamber 108 via recirculation loop 115, such as continuously for a desired period of time or discontinuously a desired number of times.

Processing system 100 can comprise a process chemistry supply system 130. In the illustrated embodiment, the process chemistry supply system is coupled to the recirculation system 120 using one or more lines 135, but this is not required for the invention. In alternate embodiments, the process chemical supply system 130 can be configured differently and can be coupled to different elements in the processing system 100. For example, the process chemistry supply system 130 can be coupled to the process module 110.

The process chemistry is introduced by the process chemistry supply system 130 into the fluid introduced by the high-pressure fluid supply system 140 at ratios that vary with the substrate properties, the chemistry being used, and the process being performed in the processing chamber 108. The ratio can vary from approximately 0.001 to approximately 15 percent by volume. For example, when the recirculation loop 115 comprises a volume of about one liter, the process chemistry volumes can range from approximately ten microliters to approximately one hundred fifty milliliters. In alternate embodiments, the volume and/or the ratio may be higher or lower. In accordance with the present invention, the process chemistry supply system 130 may be configured to introduce, at a minimum, a cleaning chemistry and a functionalizing agent, as discussed further below.

The process chemistry supply system 130 can be configured to introduce one or more of the following process compositions, but not limited to: cleaning compositions for removing contaminants, residues, hardened residues, photoresist, hardened photoresist, post-etch residue, post-ash residue, post chemical-mechanical polishing (CMP) residue, post-polishing residue, or post-implant residue, or any combination thereof; cleaning compositions for removing particulate; drying compositions for drying thin films, porous thin films, porous low dielectric constant materials, or air-gap dielectrics, or any combination thereof; film-forming compositions for preparing dielectric thin films, metal thin films, or any combination thereof; healing compositions for restoring the dielectric constant of low dielectric constant (low-k) films; sealing compositions for sealing porous films; or any combination thereof. Additionally, the process chemistry supply system 130 can be configured to introduce solvents, surfactants, etchants, acids, bases, chelators, oxidizers, film-forming precursors, or reducing agents, or any combination thereof.

The process chemistry supply system 130 can be configured to introduce N-methyl pyrrolidone (NMP), diglycol amine, hydroxyl amine, di-isopropyl amine, tri-isopropyl amine, tertiary amines, catechol, ammonium fluoride, ammonium bifluoride, methylacetoacetamide, ozone, propylene glycol monoethyl ether acetate, acetylacetone, dibasic esters, ethyl lactate, $CHF_3$, $BF_3$, HF, other fluorine containing chemicals, or any mixture thereof. Other chemicals such as organic solvents may be utilized independently or in conjunction with the above chemicals to remove organic materials. The organic solvents may include, for example, an alcohol, ether, and/or glycol, such as acetone, diacetone alcohol, dimethyl sulfoxide (DMSO), ethylene glycol, methanol, ethanol, propanol, or isopropanol (IPA). For further details, see U.S. Pat. No. 6,306,564B1, filed May 27, 1998, and titled "REMOVAL OF RESIST OR RESIDUE FROM SEMICONDUCTORS USING SUPERCRITICAL CARBON DIOXIDE", and U.S. Pat. No. 6,509,141B2, filed Sep. 3, 1999, and titled "REMOVAL OF PHOTORESIST AND PHOTORESIST RESIDUE FROM SEMICONDUCTORS USING SUPERCRITICAL CARBON DIOXIDE PROCESS," both incorporated by reference herein.

The process chemistry supply system 130 can comprise post-treating chemistry assemblies (not shown) for introducing post-treating chemistry for curing, cleaning, healing (or restoring the dielectric constant of low-k materials), or sealing, or any combination, low dielectric constant films (porous or non-porous). The chemistry can include hexamethyldisilazane (HMDS), chlorotrimethylsilane (TMCS), trichloromethylsilane (TCMS), dimethylsilyldiethylamine (DMSDEA), tetramethyldisilazane (TMDS), trimethylsilyldimethylamine (TMSDMA), dimethylsilyldimethylamine (DMSDMA), trimethylsilyldiethylamine (TMSDEA), bistrimethylsilyl urea (BTSU), bis(dimethylamino)methyl silane (B[DMA]MS), bis (dimethylamino) dimethyl silane (B[DMA]DS), HMCTS, dimethylaminopentamethyldisilane (DMAPMDS), dimethylaminodimethyldisilane (DMADMDS), disila-aza-cyclopentane (TDACP), disila-oza-cyclopentane (TDOCP), methyltrimethoxysilane (MTMOS), vinyltrimethoxysilane (VTMOS), or trimethylsilylimidazole (TMSI). Additionally, the chemistry may include N-tert-butyl-1,1-dimethyl-1-(2,3,4,5-tetramethyl-2,4-cyclopentadiene-1-yl)silanamine, 1,3-diphenyl-1,1,3,3-tetramethyldisilazane, or tert-butylchlorodiphenylsilane. For further details, see U.S. patent application Ser. No. 10/682,196, filed Oct. 10, 2003, and titled "Method and System for Treating a Dielectric Film," and U.S. patent application Ser. No. 10/379,984, filed Mar. 4, 2003, and titled "Method of Passivating Low Dielectric Materials in Wafer Processing," both incorporated by reference herein.

The process chemistry supply system 130 can comprise a rinsing chemistry assembly (not shown) for providing rinsing chemistry for generating supercritical rinsing solutions within the processing chamber 108. The rinsing chemistry can include one or more organic solvents including, but not limited to, alcohols (such as methanol, ethanol, isopropanol and 1-propanol) and ketones. In one embodiment, the rinsing chemistry can comprise an alcohol and a carrier solvent. The process chemistry supply system 130 can comprise a drying chemistry assembly (not shown) for providing drying chemistry for generating supercritical drying solutions within the processing chamber 108.

In addition, the process chemistry can include chelating agents, complexing agents, oxidants, organic acids, and inorganic acids that can be introduced into supercritical carbon dioxide with one or more carrier solvents, such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such as methanol, ethanol, isopropanol and 1-propanol).

Furthermore, the process chemistry can include solvents, co-solvents, surfactants, and/or other ingredients. Examples of solvents, co-solvents, and surfactants are disclosed in co-owned U.S. Pat. No. 6,500,605, entitled "REMOVAL OF PHOTORESIST AND RESIDUE FROM SUBSTRATE USING SUPERCRITICAL CARBON DIOXIDE PROCESS", issued Dec. 31, 2002, and U.S. Pat. No. 6,277,753, entitled "REMOVAL OF CMP RESIDUE FROM SEMICONDUCTORS USING SUPERCRITICAL CARBON DIOXIDE PROCESS", issued Aug. 21, 2001, both of which are incorporated by reference herein.

Moreover, the process chemistry supply system 130 can be configured to introduce a peroxide during, for instance, cleaning processes. The peroxide can be introduced with any one of the above process chemistries, or any mixture thereof. The peroxide can include organic peroxides, or inorganic peroxides, or a combination thereof. For example, organic peroxides can include 2-butanone peroxide; 2,4-pentanedione peroxide; peracetic acid; t-butyl hydroperoxide; benzoyl peroxide; or m-chloroperbenzoic acid (mCPBA). Other peroxides can include hydrogen peroxide. Alternatively, the peroxide can include a diacyl peroxide, such as: decanoyl peroxide; lauroyl peroxide; succinic acid peroxide; or benzoyl peroxide; or any combination thereof. Alternatively, the peroxide can include a dialkyl peroxide, such as: dicumyl peroxide; 2,5-di(t-butylperoxy)-2,5-dimethylhexane; t-butyl cumyl peroxide; α,α-bis(t-butylperoxy)diisopropylbenzene mixture of isomers; di(t-amyl) peroxide; di(t-butyl) peroxide; or 2,5-di(t-butylperoxy)-2,5-dimethyl-3-hexyne; or any combination thereof. Alternatively, the peroxide can include a diperoxyketal, such as: 1,1-di(t-butylperoxy)-3,3,5-trimethyl cyclohexane; 1,1-di(t-butylperoxy)cyclohexane; 1,1-di(t-amylperoxy)-cyclohexane; n-butyl 4,4-di(t-butylperoxy)valerate; ethyl 3,3-di-(t-amylperoxy)butanoate; t-butyl peroxy-2-ethylhexanoate; or ethyl 3,3-di(t-butylperoxy)butyrate; or any combination thereof. Alternatively, the peroxide can include a hydroperoxide, such as: cumene hydroperoxide; or t-butyl hydroperoxide; or any combination thereof. Alternatively, the peroxide can include a ketone peroxide, such as: methyl ethyl ketone peroxide, or 2,4-pentanedione peroxide, or any combination thereof. Alternatively, the peroxide can include a peroxydicarbonate, such as: di(n-propyl)peroxydicarbonate, di(sec-butyl)peroxydicarbonate, or di(2-ethylhexyl) peroxydicarbonate, or any combination thereof. Alternatively, the peroxide can include a peroxyester, such as: 3-hydroxyl-1,1-dimethylbutyl peroxyneo-decanoate, α-cumyl peroxyneodecanoate; t-amyl peroxyneodecanoate, t-butyl peroxyneodecanoate, t-butyl peroxypivalate, 2,5-di (2-ethylhexanoylperoxy)-2,5-dimethylhexane, t-amyl peroxy-2-ethylhexanoate, t-butyl peroxy-2-ethylhexanoate, t-amyl peroxyacetate, t-butyl peroxyacetate, t-butyl peroxybenzoate, OO-(t-amyl) O-(2-ethylhexyl)monoperoxycarbonate, OO-(t-butyl) O-isopropyl monoperoxy-carbonate, OO-(t-butyl)O-(2-ethylhexyl) monoperoxycarbonate, polyether poly-t-butylperoxy carbonate, or t-butyl peroxy-3,5,5-trimethylhexanoate, or any combination thereof. Alternatively, the peroxide can include any combination of peroxides listed above.

In other embodiments, the process chemistry supply system 130 can be configured to introduce fluorosilicic acid. Alternatively, the process chemistry supply system 130 is configured to introduce fluorosilicic acid with a solvent, a co-solvent, a surfactant, another acid, a base, a peroxide, or an etchant. Alternatively, the fluorosilicic acid can be introduced in combination with any of the chemicals presented above. For example, fluorosilicic acid can be introduced with N,N-dimethylacetamide (DMAc), gamma-butyrolactone (BLO), dimethyl sulfoxide (DMSO), ethylene carbonate (EC), butylene carbonate (BC), propylene carbonate (PC), N-methyl pyrrolidone (NMP), dimethylpiperidone, propylene carbonate, or an alcohol (such a methanol (MeOH), 1-propanol, isopropyl alcohol (IPA), or ethanol).

In one embodiment, the process chemistry supply system 130 can be configured to introduce a functionalizing agent. For example, the functionalizing agent can include an acyl halide (e.g., benzyl chloride), an alkyl halide (e.g., chloromethane, chloroethane, 2-chloroisopropane, etc.), and/or an acyl alcohol (e.g., benzyl alcohol). The functionalizing agent can be introduced with a solvent or a co-solvent. Alternatively, the functionalizing agent can be introduced in combination with any of the chemicals presented above.

The processing system 100 can comprise a high-pressure fluid supply system 140. As shown in FIG. 1, the high-pressure fluid supply system 140 can be coupled to the recirculation system 120 using one or more lines 145, but this is not required. The inlet line 145 can be equipped with one or more back-flow valves, and/or heaters (not shown) for controlling the fluid flow from the high-pressure fluid supply system 140. In alternate embodiments, high-pressure fluid supply system 140 can be configured differently and coupled differently. For example, the high-pressure fluid supply system 140 can be coupled to the process module 110.

The high-pressure fluid supply system 140 can comprise a carbon dioxide source (not shown) and a plurality of flow control elements (not shown) for generating a supercritical fluid. For example, the carbon dioxide source can include a $CO_2$ feed system, and the flow control elements can include supply lines, valves, filters, pumps, and heaters. The high-pressure fluid supply system 140 can comprise an inlet valve (not shown) that is configured to open and close to allow or prevent the stream of supercritical carbon dioxide from flowing into the processing chamber 108. For example, controller 180 can be used to determine fluid parameters such as pressure, temperature, process time, and flow rate.

The processing system 100 can also comprise a pressure control system 150. As shown in FIG. 1, the pressure control system 150 can be coupled to the process module 110 using one or more lines 155, but this is not required. Line 155 can be equipped with one or more back-flow valves, and/or heaters (not shown) for controlling the fluid flow to pressure control system 150. In alternate embodiments, pressure control system 150 can be configured differently and coupled differently. The pressure control system 150 can include one or more pressure valves (not shown) for exhausting the processing chamber 108 and/or for regulating the pressure within the processing chamber 108. Alternately, the pressure control system 150 can also include one or more pumps (not shown). For example, one pump may be used to increase the pressure within the processing chamber 108, and another pump may be used to evacuate the processing chamber 108. In another embodiment, the pressure control system 150 can comprise means for sealing the processing chamber 108. In addition, the pressure control system 150 can comprise means for raising and lowering the substrate 105 and/or the chuck 118.

Furthermore, the processing system 100 can comprise an exhaust control system 160. As shown in FIG. 1, the exhaust control system 160 can be coupled to the process module 110 using one or more lines 165, but this is not required. Line 165 can be equipped with one or more back-flow valves, and/or heaters (not shown) for controlling the fluid flow to the exhaust control system 160. In alternate embodiments, exhaust control system 160 can be configured differently and coupled differently. The exhaust control system 160 can include an exhaust gas collection vessel (not shown) and can be used to remove contaminants from the processing fluid. Alternately, the exhaust control system 160 can be used to recycle the processing fluid.

In one embodiment, controller 180 can comprise a processor 182 and a memory 184. Memory 184 can be coupled to processor 182, and can be used for storing information and instructions to be executed by processor 182. Alternately, different controller configurations can be used. In addition, controller 180 can comprise a port 185 that can be used to couple processing system 100 to another system (not shown). Furthermore, controller 180 can comprise input and/or output devices (not shown).

In addition, one or more of the processing elements (110, 120, 130, 140, 150, 160, and 180) may include memory (not shown) for storing information and instructions to be executed during processing and processors for processing information and/or executing instructions. For example, the memory may be used for storing temporary variables or other intermediate information during the execution of instructions by the various processors in the system. One or more of the processing elements can comprise the means for reading data and/or instructions from a computer readable medium. In addition, one or more of the processing elements can comprise the means for writing data and/or instructions to a computer readable medium.

Memory devices can include at least one computer readable medium or memory for holding computer-executable instructions programmed according to the teachings of the invention and for containing data structures, tables, records, or other data described herein. Controller 180 can use data from computer readable medium memory to generate and/or execute computer executable instructions. The processing system 100 can perform a portion or all of the processing steps of the invention in response to the controller 180 executing one or more sequences of one or more computer-executable instructions contained in a memory. Such instructions may be received by the controller from another computer, a computer readable medium, or a network connection.

Stored on any one or on a combination of computer readable media, the present invention includes software for controlling the processing system 100, for driving a device or devices for implementing the invention, and for enabling the processing system 100 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to a processor for execution and/or that participates in storing information before, during, and/or after executing an instruction. A computer readable medium may take many forms, including but not limited to, non-volatile media, volatile media, and transmission media. The term "computer-executable instruction" as used herein refers to any computer code and/or software that can be executed by a processor, that provides instructions to a processor for execution and/or that participates in storing information before, during, and/or after executing an instruction.

Controller 180, processor 182, memory 184 and other processors and memory in other system elements as described thus far can, unless indicated otherwise below, be constituted by components known in the art or constructed according to principles known in the art. The computer readable medium and the computer executable instructions can also, unless indicated otherwise below, be constituted by components known in the art or constructed according to principles known in the art.

Controller 180 can use port 185 to obtain computer code and/or software from another system (not shown), such as a factory system. The computer code and/or software can be used to establish a control hierarchy. For example, the processing system 100 can operate independently, or can be controlled to some degree by a higher-level system (not shown).

The controller 180 can use data from one or more of the system components to determine when to alter, pause, and/or stop a process. The controller 180 can use the data and operational rules to determine when to change a process and how to change the process, and rules can be used to specify the action taken for normal processing and the actions taken on exceptional conditions. Operational rules can be used to determine which processes are monitored and which data is used. For example, rules can be used to determine how to manage the data when a process is changed, paused, and/or stopped. In general, rules allow system and/or tool operation to change based on the dynamic state of the system.

Controller 180 can receive, send, use, and/or generate pre-process data, process data, and post-process data, and this data can include lot data, batch data, run data, composition data, and history data. Pre-process data can be associated with an incoming substrate and can be used to establish an input state for a substrate and/or a current state for a process module. Process data can include process parameters. Post processing data can be associated with a processed substrate and can be used to establish an output state for a substrate.

The controller 180 can use the pre-process data to predict, select, or calculate a set of process parameters to use to process the substrate. The pre-process data can include data describing the substrate to be processed. For example, the pre-process data can include information concerning the substrate's materials, the number of layers, the materials used for the different layers, the thickness of materials in the layers, the size of vias and trenches, the amount/type of process residue, the amount/type of oxidized and/or partially oxidized process residue, and a desired process result. The pre-process data can be used to determine a process recipe and/or process model. A process model can provide the relationship between one or more process recipe parameters and one or more process results. A process recipe can include a multi-step process involving a set of process modules. Post-process data can be obtained at some point after the substrate has been processed. For example, post-process data can be obtained after a time delay that can vary from minutes to days.

The controller can compute a predicted state for the substrate based on the pre-process data, the process characteristics, and a process model. For example, a treatment model can be used along with a material type and thickness to compute a predicted process residue removal time. In addition, a removal rate model can be used along with the type of process residue and/or residue amount to compute a processing time for a removal process.

In one embodiment, the substrate can comprise at least one of a semiconductor material, a metallic material, a polysilicon material, low-k material, and process-related material. For example, the process-related material can include photoresist and/or photoresist residue, oxidized and/or partially oxidized residues. One process recipe can include steps for oxidizing residues and removing oxidized and/or partially oxidized residues from patterned or un-patterned low-k material. Additional process steps can include steps for cleaning, rinsing, and sealing low-k material. Those skilled in the art will recognize that low-k material can include low-k and ultra-low-k material.

It will be appreciated that the controller 180 can perform other functions in addition to those discussed here. The controller 180 can monitor the pressure, temperature, flow, or other variables associated with the processing system 100 and take actions based on these values. For example, the controller 180 can process measured data, display data and/or results on a GUI screen, determine a fault condition, determine a response to a fault condition, and alert an operator. The controller 180 can comprise a database component (not shown) for storing input and output data.

Figure 2:
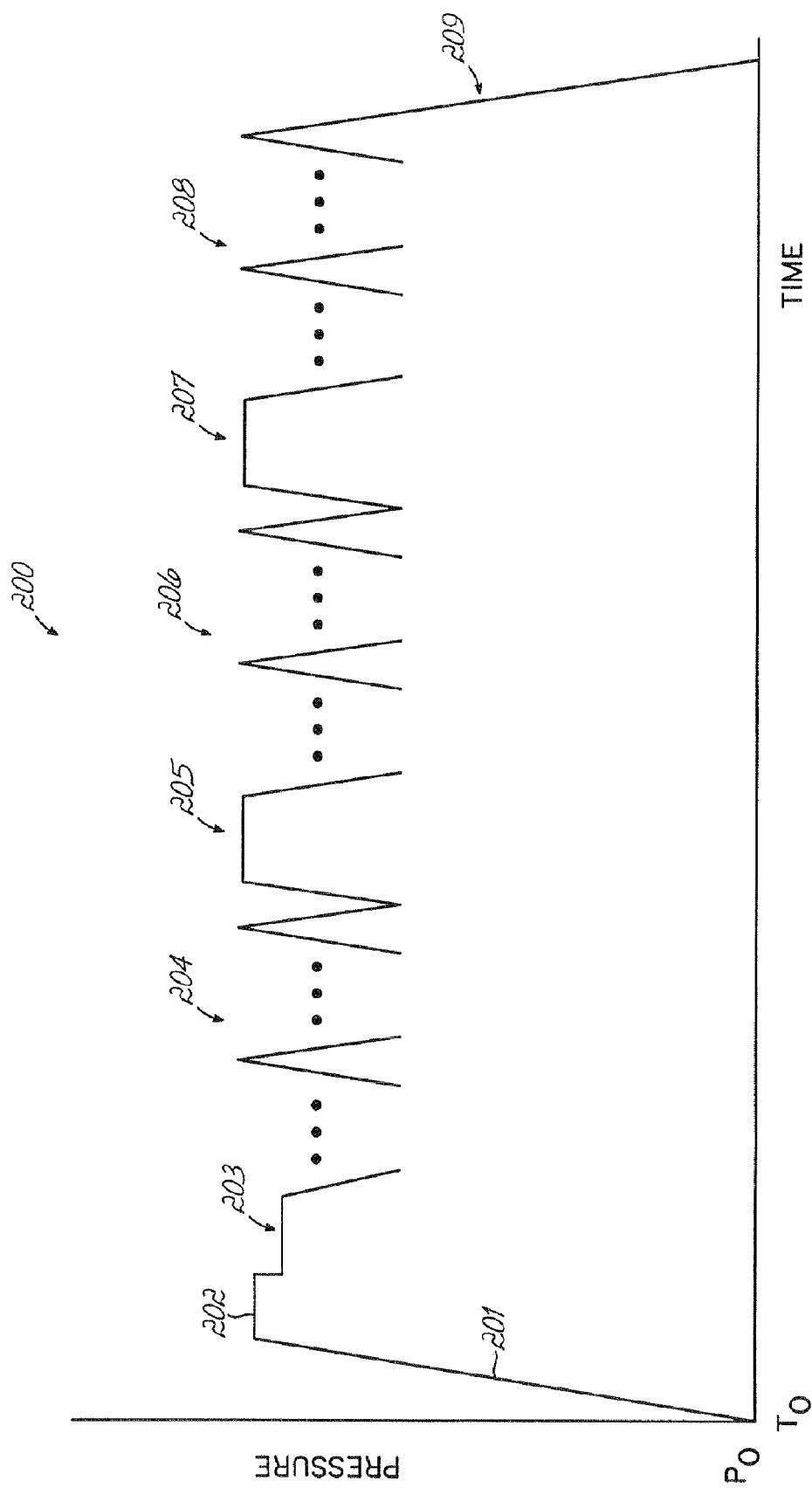
FIG. 2 illustrates an exemplary graph of pressure versus time for a supercritical process step in accordance with an embodiment of the invention.

FIG. 2 illustrates an exemplary graph of pressure versus time for a supercritical process in accordance with an embodiment of the invention. In the illustrated embodiment, a graph 200 of pressure versus time is shown, and the graph 200 can be used to represent a supercritical residue removal process. Alternately, different pressures, different timing, and different sequences may be used for different processes.

Referring to FIGS. 1 and 2, prior to an initial time $T_0$, the substrate to be processed can be placed within the processing chamber 108 and the processing chamber 108 can be sealed. During a residue removal process, a substrate having dielectric material and process-related residue on exposed surfaces can be positioned in the chamber. For example, a substrate can comprise low-k and/or ultra low-k material, exposed and/or unexposed metal, and process-related residue, such as photoresist, photoresist residue, oxidized residue, and/or partially oxidized residue. The substrate 105, the processing chamber 108, and the other elements in the recirculation loop 115 (FIG. 1) can be heated to an operational temperature. For example, the operational temperature can range from 40 to 300 degrees Celsius.

During time 201, the processing chamber 108 and the other elements in the recirculation loop 115 can be pressurized. For example, a supercritical fluid, such as substantially pure $CO_2$, can be used to pressurize the processing chamber 108 and the other elements in the recirculation loop 115 (FIG. 1). During time 201, a pump (not shown), can be started and can be used to circulate the supercritical fluid through the processing chamber 108 and the other elements in the recirculation loop 115 (FIG. 1). For example, the recirculation system 120 can comprise a recirculation pump. In an alternate embodiment, process chemistry may be injected during time 201.

During a second time 202, process chemistry can be introduced. In one embodiment, when the pressure in the processing chamber 108 exceeds a critical pressure Pc (1,070 psi), process chemistry can be injected into the processing chamber 108, using the process chemistry supply system 130. For example, the injection(s) of the process chemistries can begin upon reaching about 1100-1200 psi. In alternate embodiments, process chemistry may be injected into the processing chamber 108 before the pressure exceeds the critical pressure Pc (1,070 psi) using the process chemistry supply system 130. In one embodiment, process chemistry is injected in a linear fashion, and the injection time can be based on a recirculation time. For example, the recirculation time can be determined based on the length of the recirculation path and the flow rate. In other embodiments, process chemistry may be injected in a non-linear fashion. For example, process chemistry can be injected in one or more steps.

In one embodiment, the process chemistry can include a cleaning agent that is injected into the supercritical fluid. Alternately, the process chemistry may include a pre-treating agent, or a cleaning agent, or a rinsing agent, or a drying agent, or a combination thereof that is injected into the supercritical fluid. One or more injections of process chemistries can be performed during time 202 to generate a supercritical processing solution with the desired concentrations of chemicals. The process chemistry, in accordance with the embodiments of the invention, can also include one or more carrier solvents.

During the second time 202, the supercritical processing solution can also be re-circulated over the substrate and through the processing chamber 108 using the recirculation system 120, such as described above. In one embodiment, process chemistry is not injected during the second time 202. Alternatively, process chemistry may be injected into the processing chamber 108 before the second time 202 or after the second time 202.

In one embodiment, the process chemistry used during one or more steps in a residue removal process can include a high polarity solvent. Solvents, such as alcohols and water can be used. In another embodiment, the process chemistry used can include alcohol, acetic acid, and water.

The processing chamber 108 can operate at a pressure above 2,200 psi during the second time 202. For example, the pressure can range from approximately 2,500 psi to approximately 3,500 psi, but can be any value so long as the operating pressure is sufficient to maintain supercritical conditions. The supercritical conditions within the processing chamber 108 and the other elements in the recirculation loop 115 (FIG. 1) are maintained during the second time 202, and the supercritical processing solution continues to be circulated over the substrate and through the processing chamber 108 and the other elements in the recirculation loop 115 (FIG. 1). A pump (not shown) can be used to regulate the flow of the supercritical processing solution through the processing chamber 108 and the other elements in the recirculation loop 115 (FIG. 1).

In one embodiment, during the second time 202, the pressure can be substantially constant. Alternatively, the pressure may have different values during different portions of the second time 202.

In one embodiment, the process chemistry used during one or more steps in a cleaning process can be injected at a pressure above approximately 2200 psi and circulated at a pressure above approximately 2700 psi. In an alternate embodiment, the process chemistry used during one or more steps in a cleaning process can be injected at a pressure above approximately 2500 psi and circulated at a pressure above approximately 2500 psi.

During a third time 203, a push-through process can be performed. In an alternate embodiment, a push-through process may not be required after each cleaning step. During the third time 203, a new quantity of temperature-controlled supercritical carbon dioxide can be fed into the processing chamber 108 and the other elements in the recirculation loop 115 from the high-pressure fluid supply system 140, and the supercritical corrosion inhibiting solution along with process residue suspended or dissolved therein can be displaced from the processing chamber 108 and the other elements in the recirculation loop 115 through the exhaust control system 160. In an alternate embodiment, supercritical carbon dioxide can be fed into the recirculation system 120 from the high-pressure fluid supply system 140, and the supercritical corrosion inhibiting solution along with process residue suspended or dissolved therein can be displaced from the processing chamber 108 and the other elements in the recirculation loop 115 through the exhaust control system 160.

The high-pressure fluid supply system 140 can comprise means for providing one or more volumes of temperature-controlled fluid during a push-through process, and the volumes can be larger than the volume of the recirculation loop 115. Alternately, one or more of the volumes can be less than or approximately equal to the volume of the recirculation loop 115. In addition, the temperature differential within the one or more volumes of temperature-controlled fluid during the push-through process cycle can be controlled to be less than approximately ten degrees Celsius. Providing temperature-controlled fluid during the push-through process prevents process residue suspended or dissolved within the fluid being displaced from the processing chamber 108 and the other elements in the recirculation loop 115 from dropping out and/or adhering to the processing chamber 108 and the other elements in the recirculation loop 115.

In one embodiment, a single push-through process can be performed after a cleaning process is performed. In an alternate embodiment, one or more push-through processes may be used after a cleaning process is performed.

In the illustrated embodiment shown in FIG. 2, a single second time 202 is followed by a single third time 203, but this is not required. In alternate embodiments, other time sequences may be used to process a substrate.

During a fourth time 204, a decompression process can be performed. In an alternate embodiment, a decompression process is not required. During the fourth time 204, the processing chamber 108 can be cycled through one or more decompression cycles and one or more compression cycles. The pressure can be cycled between a first pressure and a second pressure one or more times. In alternate embodiments, the first pressure and a second pressure can vary. For example, this can be accomplished by lowering the pressure to below approximately 2,500 psi and raising the pressure to above approximately 2,500 psi. In one embodiment, the pressure can be lowered by venting through the exhaust control system 160. The pressure can be increased by adding high-pressure carbon dioxide. In an alternate embodiment, during a portion of the fourth time 204, one or more additional pressures may be established.

The high-pressure fluid supply system 140 can comprise means for providing a first volume of temperature-controlled fluid during a compression cycle, and the first volume can be larger than the volume of the recirculation loop 115. Alternately, the first volume can be less than or approximately equal to the volume of the recirculation loop 115. In addition, the temperature differential within the first volume of temperature-controlled fluid during the compression cycle can be controlled to be less than approximately ten degrees Celsius. In addition, the high-pressure fluid supply system 140 can comprise means for providing a second volume of temperature-controlled fluid during a decompression cycle, and the second volume can be larger than the volume of the recirculation loop 115. Alternately, the second volume can be less than or approximately equal to the volume of the recirculation loop 115. In addition, the temperature differential within the second volume of temperature-controlled fluid during the decompression cycle can be controlled to be less than approximately twenty degrees Celsius. Alternately, the temperature variation of the temperature-controlled fluid can be controlled to be less than approximately ten degrees Celsius during a decompression cycle.

Process steps 202, 203, and 204 can be repeated a number of times to achieve a desired process result, and a unique process recipe can be established for each different combination of the process steps. A process recipe can be used to establish the process parameters used during the different process recipes to process and/or remove different process-related residues. In addition, the process parameters can be different during the different process steps based on the type of removal process being performed. For example, a process recipe established for processing and/or removing process-related residues on one type of substrate from one manufacturer line can be different from the process recipe established for processing and/or removing process-related residues on another type of substrate from a different manufacturer line.

During a cleaning process, for example during the second time 202, a substrate can be processed using one or more oxidation steps. For example, it is common to oxidize the substrate during the removal of post etch and post ash residue from the substrate. The process of oxidation causes the substrate structure to cleave at several points leaving smaller fragments of oxidized residue behind. This residue has only minimal solubility in supercritical $CO_2$ due to the polar constituents resulting from oxidation.

After the cleaning process, a treatment process can be performed in which the substrate can be treated using a functionalizing agent. For example, the functionalizing agent can include acyl halide (benzyl chloride), alkyl halide (chloromethane, chloroethane, 2-chloroisopropane, etc.), and/or acyl alcohols (benzyl alcohol). The functionalizing agent can react with the smaller fragments and other less soluble components, and these functionalized components are rendered more soluble in supercritical $CO_2$ and are more easily removed than their predecessors.

The treatment process can be performed during a fifth time 205. In the illustrated embodiment, a single step treatment process is shown, but this is not required. Alternately, a multi-step treatment process may be performed. In another embodiment, a variable pressure treatment process may be performed. For example, this can be accomplished by lowering the pressure to below approximately 2,500 psi and raising the pressure to above approximately 2,500 psi. The pressure can be changed by adding and/or removing high-pressure carbon dioxide.

In one embodiment, a treatment pressure is established during the fifth time 205 using supercritical carbon dioxide. For example, the processing chamber can be pressurized to above approximately 2500 psi. In addition, a treatment chemistry can be introduced into the processing chamber. Then, the treatment chemistry can be recirculated through the processing chamber, such as by a recirculation loop, for a first period of time to remove the remaining portions of the process-related residue from a surface of the substrate. In one embodiment, the first period of time is less than about three minutes. Alternately, the first period of time may vary from approximately ten seconds to approximately ten minutes. Furthermore, additional treatment chemistry (functionalizing agent) and/or supercritical fluid may be provided.

In an alternate embodiment, the functionalizing agent may be injected at a lower pressure; the pressure of the processing chamber can be increased; and the functionalizing agent can be recirculated through the processing chamber, such as by a recirculation loop, for a period of time.

During a sixth time 206, a decompression process can be performed. In an alternate embodiment, a decompression process is not required. During the sixth time 206, the processing chamber 108 can be cycled through one or more decompression cycles and one or more compression cycles. The pressure can be cycled between a first pressure and a second pressure one or more times. In alternate embodiments, the first pressure and a second pressure can vary. For example, this can be accomplished by lowering the pressure to below approximately 2,500 psi and raising the pressure to above approximately 2,500 psi. In one embodiment, the pressure can be lowered by venting through the exhaust control system 160, and the pressure can be increased by adding supercritical carbon dioxide.

Process steps 205 and 206 can be repeated a number of times to achieve a desired process result, and different treatment recipes can be established for each different combination of the process parameters.

In an alternate embodiment, one or more push-through processes (not shown) may be performed before process step 206. During a push-through process, a new quantity of supercritical carbon dioxide can be fed into the processing chamber 108 and the other elements in the recirculation loop 115, and the supercritical treatment solution along with process residue suspended or dissolved therein can be displaced from the processing chamber 108 and the other elements in the recirculation loop 115 through the exhaust control system 160.

Process steps 202, 203, 204, 205, and 206 can be repeated a number of times to achieve a desired process result for a particular material, and different combinations of cleaning recipes and treatment recipes can be established for each different combination of the process parameters. A cleaning/treatment recipe can be used to establish the cleaning/treatment chemistry, cleaning/treatment time, and number of process cycles.

During a seventh time 207, a rinsing process can be performed. In an alternate embodiment, a rinsing process is not required. Alternately, a drying step, a rinsing step, a cleaning step, a push-through step, a pore sealing step, a dielectric repair step, or an etching step, or a combination thereof can be performed.

In the illustrated embodiment, a single step rinsing process is shown, but this is not required. Alternately, a multi-step rinsing process may be performed. In another embodiment, a variable pressure rinsing process may be performed. For example, this can be accomplished by lowering the pressure to below approximately 2,500 psi and raising the pressure to above approximately 2,500 psi. The pressure can be changed by adding and/or removing high-pressure carbon dioxide.

In one embodiment, a rinsing pressure is established during the seventh time 207 using supercritical carbon dioxide. For example, the processing chamber can be pressurized to above approximately 2500 psi. In addition, a rinsing chemistry can be introduced into the processing chamber. Then, the rinsing chemistry can be recirculated through the processing chamber, such as by a recirculation loop, for a period of time to remove the remaining portions of the process-related residue from a surface of the substrate and/or to remove the remaining portions of the treatment chemistry. In one embodiment, the first period of time is less than about three minutes. Alternately, the period of time may vary from approximately ten seconds to approximately ten minutes. Furthermore, additional rinsing chemistry and/or supercritical fluid may be provided.

In an alternate embodiment, the rinsing chemistry may be injected at a lower pressure; the pressure of the processing chamber can be increased; and the rinsing chemistry can be recirculated through the processing chamber, such as by a recirculation loop, for a period of time.

During an eighth time 208, a decompression process can be performed. In an alternate embodiment, a decompression process is not required. During the eighth time 208, the processing chamber 108 can be cycled through one or more decompression cycles and one or more compression cycles. The pressure can be cycled between a first pressure and a second pressure one or more times. In alternate embodiments, the first pressure and a second pressure can vary. For example, this can be accomplished by lowering the pressure to below approximately 2,500 psi and raising the pressure to above approximately 2,500 psi. In one embodiment, the pressure can be lowered by venting through the exhaust control system 160, and the pressure can be increased by adding supercritical carbon dioxide.

Process steps 207 and 208 can be repeated a number of times to achieve a desired process result, and different rinsing recipes can be established for each different combination of the process parameters. The recipe for a rinsing process can be used to establish the rinsing chemistry, the rinsing process time, and number of decompression cycles.

In an alternate embodiment, one or more push-through processes (not shown) may be performed before process step 208. During a push-through process, a new quantity of supercritical carbon dioxide can be fed into the processing chamber 108 and the other elements in the recirculation loop 115, and the supercritical treatment solution along with process residue suspended or dissolved therein can be displaced from the processing chamber 108 and the other elements in the recirculation loop 115 through the exhaust control system 160.

Process steps 202, 203, 204, 205, 206, 207, and 208 can be repeated a number of times to achieve a desired process result for a particular material, and different combinations of cleaning recipes, treatment recipes, and rinsing recipes can be established for each different combination of the process parameters. A cleaning/treatment/ rinsing recipe can be used to establish the cleaning/treatment/ rinsing chemistry, cleaning/treatment/ rinsing time, and number of process cycles.

During a ninth time 209, the processing chamber 108 can be returned to lower pressure. For example, after the decompression and compression cycles are complete, then the processing chamber can be vented or exhausted to a transfer system pressure. For substrate processing, the chamber pressure can be made substantially equal to the pressure inside of a transfer system (not shown) coupled to the processing chamber. In one embodiment, the substrate can be moved from the processing chamber into the transfer, and moved to a second process apparatus or module to continue processing.

In the illustrated embodiment shown in FIG. 2, the pressure returns to an initial pressure $P_0$, but this is not required for the invention. In alternate embodiments, the pressure does not have to return to $P_0$, and the process sequence can continue with additional time steps such as those shown in time steps 201, 202, 203, 204, 205, 206, 207, and/or 208.

The graph 200 is provided for exemplary purposes only. It will be understood by those skilled in the art that a supercritical process can have any number of steps having different time/pressures or temperature profiles without departing from the scope of the invention. Further, any number of cleaning, treating, and rinsing process sequences with each step having any number of compression and decompression cycles are contemplated. In addition, as stated previously, concentrations of various chemicals and species within a supercritical processing solution can be readily tailored for the application at hand and altered at any time within a supercritical processing step.

In addition, additional processing steps can be performed after a residue removal process is performed. For example, a pore sealing, a k-value restoration, a rinsing process, a cleaning process, or a drying process, or a combination thereof can be performed. These additional processes may require other processing chemistry to be circulated through the processing chamber, such as by a recirculation loop. For example, the removal chemistry can include alcohol and water, and the rinsing chemistry does not include water. Alternately, drying steps may be included.

In another embodiment, the controller 180 can use historical data and/or process models to compute an expected value for the temperature of the fluid at various times during the process. The controller 180 can compare an expected temperature value to a measured temperature value to determine when to alter, pause, and/or stop a process.

In a supercritical process, the desired process result can be a process result that is measurable using an optical measuring device, such as a Scanning Electron Microscope (SEM) and/or Transmission Electron Microscope (TEM). For example, the desired process result can be an amount of residue and/or contaminant in a via or on the surface of a substrate. After one or more processing steps, the desired process can be measured. In other embodiments, the desired process result can be a process result that is measurable using Fourier Transform Infrared Spectroscopy (FTIR) which is an analytical technique used to identify materials. The FTIR technique measures the absorption of various infrared light wavelengths by the material of interest. These infrared absorption bands identify specific molecular components and structures. The absorption bands in the region between 1500-400 wave numbers are generally due to intra-molecular phenomena, and are highly specific for each material. The specificity of these bands allows computerized data searches to be performed against reference libraries to identify a material and/or identify the presence of a material.

Figure 3:
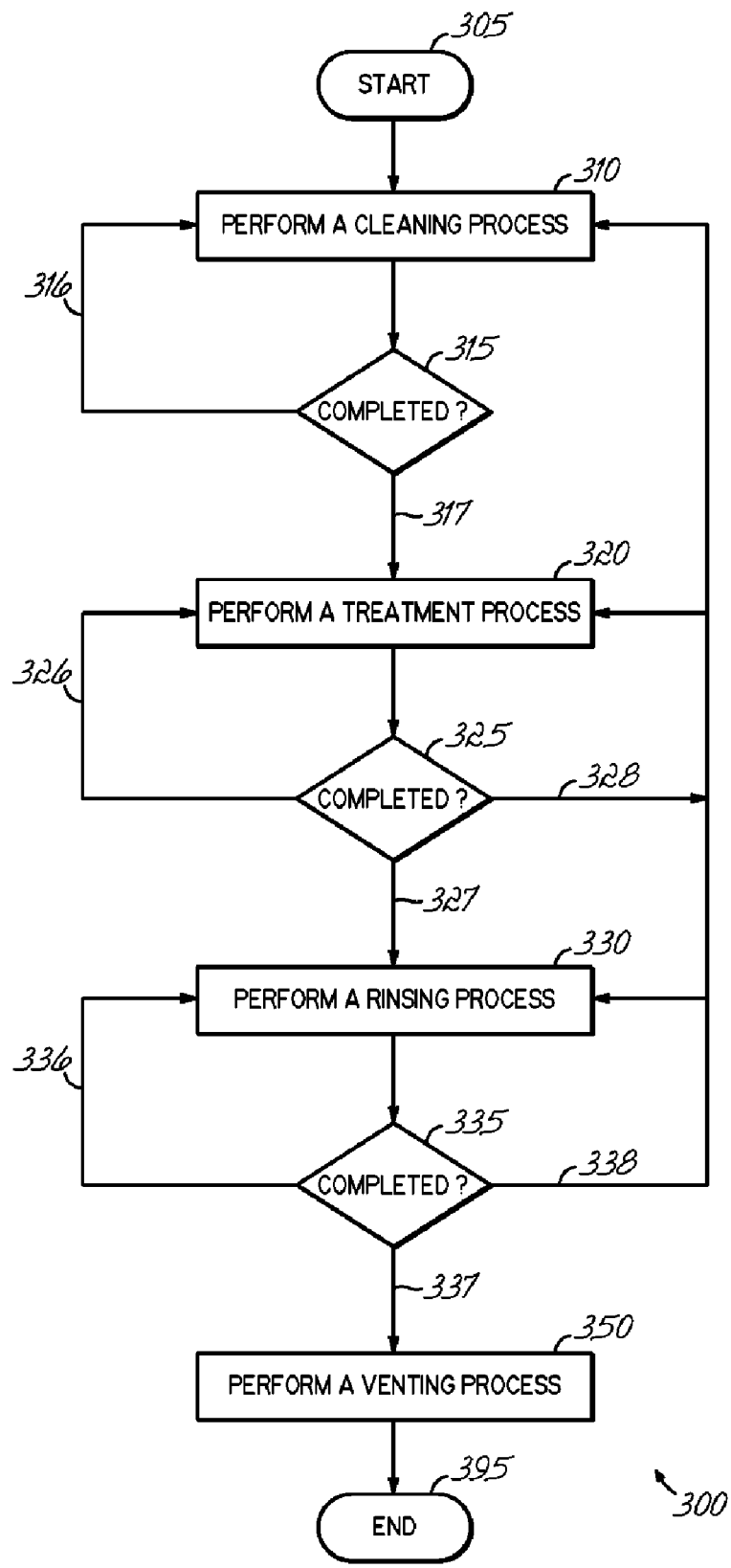
FIG. 3 illustrates a flow chart of a method of performing a supercritical residue removal process on a substrate in accordance with embodiments of the present invention.

FIG. 3 illustrates a flow chart of a method of performing a supercritical residue removal process on a substrate in accordance with embodiments of the present invention. Procedure 300 can start in 305.

Referring to FIGS. 1-3, the substrate 105 to be processed can be placed within the processing chamber 108 and the processing chamber 108 can be sealed. For example, during a supercritical residue removal process, the substrate 105 being processed can comprise semiconductor material, low-k dielectric material, metallic material, and can have process-related residue thereon. The substrate 105, the processing chamber 108, and the other elements in the recirculation loop 115 can be heated to an operational temperature. For example, the operational temperature can range from approximately 40 degrees Celsius to approximately 300 degrees Celsius. In some examples, the temperature can range from approximately 80 degrees Celsius to approximately 150 degrees Celsius.

In addition, the processing chamber 108 and the other elements in the recirculation loop 115 can be pressurized. For example, a supercritical fluid, such as substantially pure $CO_2$, can be used to pressurize the processing chamber 108 and the other elements in the recirculation loop 115. A pump (not shown) can be used to circulate the supercritical fluid through the processing chamber 108 and the other elements in the recirculation loop 115.

In 310, a cleaning process can be performed. In one embodiment, a supercritical cleaning process can be performed. Alternately, a non-supercritical cleaning process can be performed. In one embodiment, a supercritical cleaning process 310 can include recirculating the cleaning chemistry through the processing chamber 108, such as via recirculation loop 115. Recirculating the cleaning chemistry over the substrate 105 within the processing chamber 108 can comprise recirculating the cleaning chemistry for a period of time to process and/or remove one or more materials and/or residues from the substrate.

In one embodiment, one or more push-through steps can be performed as a part of the cleaning process. During a push-through step, a new quantity of supercritical carbon dioxide can be fed into the processing chamber 108 and the other elements in the recirculation loop 115, and the supercritical cleaning solution along with the process byproducts suspended or dissolved therein can be displaced from the processing chamber 108 and the other elements in the recirculation loop 115 through the exhaust control system 160. In an alternate embodiment, a push-through step is not required during a cleaning step. For example, process byproducts can include photoresist materials and/or residues including oxidized and partially oxidized materials.

In one embodiment, dielectric material can be processed and one or more photoresist materials and/or residues can be removed from the low-k dielectric material using process chemistry that includes one or more cleaning agents and one or more solvents.

In 315, a query is performed to determine when the cleaning process has been completed. When the cleaning process is completed, procedure 300 can branch via 317 to 320 and continues. When the cleaning process is not completed, procedure 300 branches back via 316 to 310 and the cleaning process continues. One or more process recipes can be performed during a cleaning process. For example, different chemistries, different concentrations, different process conditions, and/or different times can be used in different cleaning process steps.

In 320, a treatment process can be performed while maintaining the processing system in a high pressure state. A treatment process can be performed in which the substrate is treated using a functionalizing agent. For example, the functionalizing agent can include an acyl halide (e.g., benzyl chloride), an alkyl halide (e.g., chloromethane, chloroethane, 2-chloroisopropane, etc.), and/or an acyl alcohol (e.g., benzyl alcohol). The functionalizing agent can react with the smaller fragments and other less soluble components, and these functionalized components are rendered more soluble in supercritical $CO_2$ and are more easily removed than their predecessors. Treatment processes can be performed after an oxidation process, or after an etching process, or after an oxidation/etching process.

The treatment process can be a multi-step process. For example, the processing chamber can be pressurized to above approximately 2500 psi, and a treatment chemistry can be introduced into the processing chamber. Then, the treatment chemistry can be re-circulated through the processing chamber 108, such as via recirculation loop 115, for a period of time to remove the remaining portions of the process-related residue from a surface of the substrate. In one embodiment, the period of time is less than about three minutes. Alternately, the period of time may vary from approximately ten seconds to approximately ten minutes. Furthermore, additional treatment chemistry (functionalizing agent) and/or supercritical fluid may be provided.

In an alternate embodiment, the functionalizing agent may be injected at a lower pressure; the pressure of the processing chamber can be increased; and the functionalizing agent can be recirculated through the processing chamber 108, such as via recirculation loop 115, for a period of time.

In one embodiment, one or more push-through steps can be performed as a part of the treatment process. During a push-through step, a new quantity of temperature-controlled supercritical carbon dioxide can be fed into the processing chamber 108 and the other elements in the recirculation loop 115, and the supercritical treatment solution along with the process byproducts suspended or dissolved therein can be displaced from the processing chamber 108 and the other elements in the recirculation loop 115 through the exhaust control system 160. In an alternate embodiment, a push-through step is not required during a cleaning step. For example, process byproducts can include photoresist materials and/or residues including oxidized and partially oxidized materials.

In one embodiment, one or more decompression processes can be performed as a part of the treatment process. During a decompression process, the processing chamber 108 can be cycled through one or more decompression cycles and one or more compression cycles. The pressure can be cycled between a higher pressure and a lower pressure one or more times. In alternate embodiments, the pressures can vary. In one embodiment, the pressure can be lowered by venting through the exhaust control system 160. For example, this can be accomplished by lowering the pressure to below approximately 2,500 psi and raising the pressure to above approximately 2,500 psi. The pressure can be increased by adding temperature-controlled supercritical carbon dioxide.

In 325, a query is performed to determine when the treatment process 320 has been completed. When the treatment process is completed, procedure 300 can branch via 327 to 330, and procedure 300 can continue on to step 330 if no additional treatment steps are required. Alternately, when the treatment process is completed and additional cleaning steps are required, procedure 300 can branch via 328 back to 310, and procedure 300 can continue by performing additional removal steps as required.

When the treatment process is not completed, procedure 300 can branch back via 326 to 320 and the treatment process 320 can continue. For example, different chemistries, different concentrations, different process conditions, and/or different times can be used in different treatment processes.

In 330, a rinsing process can be performed. In one embodiment, a supercritical rinsing process can be performed. Alternately, a non-supercritical rinsing process can be performed. In one embodiment, a supercritical rinsing process 310 can include recirculating the rinsing chemistry through the processing chamber 108, such as via recirculation loop 115. Recirculating the rinsing chemistry can comprise recirculating the rinsing chemistry for a period of time to process and/or remove one or more materials and/or residues from the substrate.

In one embodiment, one or more push-through steps can be performed as a part of the rinsing process. During a push-through step, a new quantity of supercritical carbon dioxide can be fed into the processing chamber 108 and the other elements in the recirculation loop 115, and the supercritical rinsing solution along with the process byproducts suspended or dissolved therein can be displaced from the processing chamber 108 and the other elements in the recirculation loop 115 through the exhaust control system 160. In an alternate embodiment, a push-through step is not required during a rinsing step. For example, process byproducts can include photoresist materials and/or residues including oxidized and partially oxidized materials.

In one embodiment, dielectric material can be processed and one or more process byproducts can be removed from the low-k dielectric material using process chemistry that includes one or more rinsing agents and one or more solvents.

In 335, a query is performed to determine when the rinsing process has been completed. When the rinsing process is completed, procedure 300 can branch via 337 to 350 and continues. Alternately, when the rinsing process is completed and additional cleaning and/or treatment processes are required, procedure 300 can branch back via 338 to 310 or 320, and procedure 300 can continue by performing additional removal and/or treatment steps as required. When the rinsing process is not completed, procedure 300 branches back via 336 to 330 and the rinsing process continues. One or more process recipes can be performed during a rinsing process. For example, different chemistries, different concentrations, different process conditions, and/or different times can be used in different rinsing process steps.

In 350, a venting process can be performed. In one embodiment, a variable pressure venting process can be performed. Alternately, a multi-pressure venting process can be performed. During a venting process, the pressure in the processing chamber 108 can be lower to a pressure that is compatible with a transfer system pressure. In one embodiment, the pressure can be lowered by venting through the exhaust control system 160.

Procedure 300 ends in 395.

After a removal process has been performed, a k-value restoration process, or a pore sealing process, or a combination process can be performed.

In additional embodiments, the processes described herein can be further supplemented by ozone processing. For example, when performing a cleaning process, the substrate can be subjected to ozone treatment prior to treating with a supercritical processing solution. During ozone treatment, the substrate enters an ozone module, and the surface residues to be removed are exposed to an ozone atmosphere. For instance, a partial pressure of ozone formed in oxygen can be flowed over the surface of the substrate for a period of time sufficient to oxidize residues either partly or wholly. The ozone process gas flow rate can, for example, range from 1 to 50 slm (standard liters per minute) and, by way of further example, the flow rate can range from 5 to 15 slm. Additionally, the pressure can, for example, range from 1 to 5 atm and, by way of further example, range from 1 to 3 atm. Further details are provided in co-pending U.S. patent application Ser. No. 10/987,594, entitled "Method for Removing a Residue from a Substrate Using Supercritical Carbon Dioxide Processing," filed on Nov. 12, 2004, and co-pending U.S. patent application Ser. No. 10/987,676, entitled "A System for Removing a Residue from a Substrate Using Supercritical Carbon Dioxide Processing," filed on Nov. 12, 2004, the entire contents of which are incorporated herein by reference in their entirety.

While the invention has been described in terms of specific embodiments incorporating details to facilitate the understanding of the principles of construction and operation of the invention, such reference herein to specific embodiments and details thereof is not intended to limit the scope of the claims appended hereto. It will be apparent to those skilled in the art that modifications may be made in the embodiments chosen for illustration without departing from the scope of the invention.

What is claimed is:

1. A method of processing a substrate comprising:
   positioning the substrate on a substrate holder in a processing chamber;
   performing a cleaning process, wherein the substrate is cleaned using a first supercritical fluid comprising supercritical $CO_2$ and a cleaning chemistry, and wherein the cleaning process is effective to at least partially oxidize a surface of the substrate and to remove at least a portion of the oxidized surface, while another portion remains as small fragments of oxidized residue; and
   performing a treatment process after the cleaning process, wherein the substrate is treated using a second supercritical fluid consisting of supercritical $CO_2$ and benzyl chloride as a functionalizing agent to react with and functionalize the small fragments of oxidized residue and render the functionalized small fragments more soluble in supercritical $CO_2$ to facilitate removal of the small fragments of oxidized residue in the second supercritical fluid.

2. The method of claim 1, wherein the substrate comprises semiconductor material, metallic material, dielectric material, or ceramic material, or a combination of two or more thereof.

3. The method of claim 2, wherein the substrate comprises a patterned dielectric material comprising a low-k material, or ultra low-k material, or a combination thereof.

4. The method of claim 1, wherein the cleaning chemistry comprises an acid and a solvent.

5. The method of claim 4, wherein the acid comprises an organic acid.

6. The method of claim 4, wherein the solvent comprises an alcohol or a ketone, or a combination thereof.

7. The method of claim 1, further comprising performing a rinsing process after the treatment process, wherein the substrate is rinsed using a third supercritical fluid comprising supercritical $CO_2$ and a rinsing chemistry, wherein the rinsing chemistry comprises an alcohol.

8. The method of claim 7, wherein the alcohol comprises ethanol, methanol, 1-propanol, or isopropanol, or a combination thereof.

9. The method of claim 7, wherein the alcohol comprises isopropyl alcohol.

10. The method of claim 7, wherein the performing a rinsing process further comprises:
    pressurizing the processing chamber to a first rinsing pressure;
    introducing the third supercritical fluid into the processing chamber; and
    recirculating the third supercritical fluid through the processing chamber.

11. The method of claim 1, wherein the performing a treatment process comprises:
    introducing the second supercritical fluid into the processing chamber; and
    recirculating the second supercritical fluid through the processing chamber for a first period of time.

12. The method of claim 11, wherein the first period of time is in a range of thirty seconds to ten minutes.

13. The method of claim 11, wherein the performing a treatment process further comprises performing a push-through process wherein the processing chamber is pressurized to an elevated pressure and vented to push the second supercritical fluid out of the processing chamber after recirculating the second supercritical fluid.

14. The method of claim 13, wherein the elevated pressure is above approximately 13780 kilo-Pascal (2000 psi).

15. The method of claim 13, wherein the performing a treatment process further comprises performing a series of decompression cycles.

16. The method of claim 1, wherein the performing a cleaning process further comprises:

pressurizing the processing chamber to a first cleaning pressure;

introducing the first supercritical fluid into the processing chamber; and recirculating the first supercritical fluid through the processing chamber.

17. A method of operating a controller in a processing system configured to process a substrate, the method comprising the steps of:

instructing the processing system to position a substrate on a substrate holder in a processing chamber;

instructing the processing system to perform a cleaning process, wherein the substrate is cleaned using a first supercritical fluid comprising supercritical $CO_2$ and a cleaning chemistry, and wherein the cleaning process is effective to at least partially oxidize a surface of the substrate and to remove at least a portion of the oxidized surface, while another portion remains as small fragments of oxidized residue; and instructing the processing system to performing a treatment process, wherein the substrate is treated using a second supercritical fluid consisting of supercritical $CO_2$ and benzyl chloride as a functionalizing agent to react with and functionalize the small fragments of oxidized residue and render the functionalized small fragments more soluble in supercritical $CO_2$ to facilitate removal of the small fragments of oxidized residue in the second supercritical fluid.

* * * * *

UNITED STATES PATENT AND TRADEMARK OFFICE
CERTIFICATE OF CORRECTION

PATENT NO. : 7,789,971 B2
APPLICATION NO. : 10/908474
DATED : September 7, 2010
INVENTOR(S) : Kevwitch It is certified that error appears in the above-identified patent and that said Letters Patent is hereby corrected as shown below:

Title Page, Col. 2, FOREIGN PATENT DOCUMENTS, "CH" should read --SE--.

Title Page 5, Col. 2, line 56, "A. Garbor et al." should read --A. Gabor et al.--.

Title Page 6, Col. 1, line 15, "Quatermary" should read --Quaternary--.

Col. 1, line 10, "May 10, 2005 entitled" should read --May 10, 2005, now abandoned, entitled--.

Col. 7, line 19, "(such a methanol" should read --(such as methanol--.

Col. 19, line 21, "can be lower to" should read --can be lowered to--.

Col. 19, line 47, "Nov. 12, 2004, and" should read --Nov. 12, 2004, now abandoned and--.

Col. 19, line 50, "Nov. 12, 2004, the" should read --Nov. 12, 2004, now abandoned, the--.

Col. 22, line 5, Claim 17, "to performing" should read --to perform--.

Signed and Sealed this
Eighteenth Day of January, 2011

David J. Kappos
*Director of the United States Patent and Trademark Office*